(12) United States Patent
Nishide et al.

(10) Patent No.: US 11,439,967 B2
(45) Date of Patent: Sep. 13, 2022

(54) CHEMICAL LIQUID PREPARATION METHOD, CHEMICAL LIQUID PREPARATION DEVICE, AND SUBSTRATE PROCESSING DEVICE

(71) Applicant: SCREEN Holdings Co., Ltd., Kyoto (JP)

(72) Inventors: Hajime Nishide, Kyoto (JP); Takashi Izuta, Kyoto (JP); Takatoshi Hayashi, Kyoto (JP); Katsuhiro Fukui, Kyoto (JP); Koichi Okamoto, Kyoto (JP); Kazuhiro Fujita, Kyoto (JP); Atsuyasu Miura, Kyoto (JP); Kenji Kobayashi, Kyoto (JP); Sei Negoro, Kyoto (JP); Hiroki Tsujikawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 934 days.

(21) Appl. No.: 16/114,253

(22) Filed: Aug. 28, 2018

(65) Prior Publication Data
US 2019/0091640 A1 Mar. 28, 2019

(30) Foreign Application Priority Data
Sep. 22, 2017 (JP) .............................. JP2017-183007

(51) Int. Cl.
*B01F 15/04* (2006.01)
*H01L 21/67* (2006.01)
(Continued)

(52) U.S. Cl.
CPC ............ *B01F 35/82* (2022.01); *B01F 23/231* (2022.01); *B01F 35/2132* (2022.01);
(Continued)

(58) Field of Classification Search
CPC .......................... H01L 21/67253; B01F 35/82
See application file for complete search history.

(56) References Cited

U.S. PATENT DOCUMENTS

| 7,237,562 B2* | 7/2007 | Shibayama | ........ B01D 19/0031 134/102.1 |
| 8,999,069 B2* | 4/2015 | Ida | .......................... C11D 7/02 134/2 |

(Continued)

FOREIGN PATENT DOCUMENTS

| JP | 2006269668 | 10/2006 |
| JP | 2009218405 | 9/2009 |

(Continued)

*Primary Examiner* — Elizabeth Insler
(74) *Attorney, Agent, or Firm* — JCIPRNET

(57) ABSTRACT

A chemical liquid preparation method of preparing a chemical liquid for treating a film formed on a substrate, including a gas dissolving process in which an oxygen-containing gas and an inert-gas-containing gas are dissolved in the chemical liquid by supplying the oxygen-containing gas which contains oxygen gas and the inert-gas-containing gas which contains an inert gas to a chemical liquid, wherein in the gas dissolving process, a dissolved oxygen concentration in the chemical liquid is adjusted by setting a mixing ratio between the oxygen-containing gas and the inert-gas-containing gas supplied to the chemical liquid as a mixing ratio corresponding to a predetermined target dissolved oxygen concentration.

9 Claims, 12 Drawing Sheets

(51) Int. Cl.
  *B01F 3/04* (2006.01)
  *B01F 15/00* (2006.01)
  *G05D 21/02* (2006.01)
  *B01F 35/82* (2022.01)
  *H01L 21/306* (2006.01)
  *G05D 11/00* (2006.01)
  *H01L 21/3213* (2006.01)
  *B01F 23/231* (2022.01)
  *B01F 35/21* (2022.01)
  *B01F 35/22* (2022.01)
  *B01F 23/237* (2022.01)
  *B01F 101/58* (2022.01)

(52) U.S. Cl.
  CPC .......... *B01F 35/2202* (2022.01); *G05D 11/00* (2013.01); *G05D 21/02* (2013.01); *H01L 21/30608* (2013.01); *H01L 21/32134* (2013.01); *H01L 21/6708* (2013.01); *H01L 21/67017* (2013.01); *H01L 21/67028* (2013.01); *H01L 21/67051* (2013.01); *H01L 21/67075* (2013.01); *B01F 23/2376* (2022.01); *B01F 23/23765* (2022.01); *B01F 23/237611* (2022.01); *B01F 2101/58* (2022.01)

(56) References Cited

U.S. PATENT DOCUMENTS

| | | |
|---|---|---|
| 9,466,513 B2 | 10/2016 | Yoshida |
| 10,186,435 B2 | 1/2019 | Miura et al. |
| 2003/0066549 A1 | 4/2003 | Noda et al. |
| 2009/0229641 A1 | 9/2009 | Yoshida |
| 2011/0030722 A1 | 2/2011 | Ida et al. |
| 2013/0306238 A1 | 11/2013 | Miura et al. |
| 2014/0080312 A1 | 3/2014 | Iwamoto et al. |
| 2017/0294323 A1 | 10/2017 | Miura et al. |

FOREIGN PATENT DOCUMENTS

| | | |
|---|---|---|
| JP | 2013258391 | 12/2013 |
| JP | 2016012645 | 1/2016 |
| JP | 2016143872 | 8/2016 |
| JP | 2018019089 | 2/2018 |
| JP | 6290016 | 3/2018 |
| JP | 6300139 | 3/2018 |
| KR | 20110007092 | 1/2011 |
| KR | 20130127914 | 11/2013 |
| TW | 200535998 | 11/2005 |
| TW | 201005086 | 2/2010 |
| TW | 201347022 | 11/2013 |

\* cited by examiner

CHEMICAL LIQUID PREPARATION METHOD, CHEMICAL LIQUID PREPARATION DEVICE, AND SUBSTRATE PROCESSING DEVICE

CROSS-REFERENCE TO RELATED APPLICATIONS

This application claims the priority benefit of Japanese Patent Application No. 2017-183007, filed on Sep. 22, 2017. The entirety of the above-mentioned patent application is hereby incorporated by reference herein and made a part of this specification.

BACKGROUND

Technical Field

The present disclosure relates to a chemical liquid preparation method, a chemical liquid preparation device, and a substrate processing device. Examples of a substrate to be processed include a semiconductor wafer, a liquid crystal display device substrate, a plasma display substrate, a field emission display (FED) substrate, an optical disc substrate, a magnetic disk substrate, a magneto-optical disc substrate, a photomask substrate, a ceramic substrate, and a solar cell substrate.

Description of Related Art

In a process of preparation a semiconductor device or a liquid crystal display device, a substrate processing device for processing a substrate such as a semiconductor wafer or a liquid crystal display device glass substrate is used. In a substrate processing device in US 2013306238 A1, in order to prevent a substrate from being oxidized due to oxygen in a chemical liquid, an amount of oxygen dissolved in a chemical liquid is reduced by degassing. A processing capacity (for example, an etching amount per unit time, that is, an etching rate) of a chemical liquid depends on a dissolved oxygen concentration (dissolved oxygen amount) in the chemical liquid. The dissolved oxygen concentration in the chemical liquid increases with the passage of time due to penetration of oxygen that passes through piping and the like. In addition, according to a height of a location at which a substrate processing device is disposed, the atmospheric pressure acting on the substrate processing device differs and a saturation concentration changes, and accordingly, a dissolved oxygen concentration in the chemical liquid changes. In order to keep a processing capacity (etching rate) of the chemical liquid constant, it is necessary to adjust a dissolved oxygen concentration in the chemical liquid to a desired concentration (target dissolved oxygen concentration) accurately.

In US 2013306238 A1, a single-wafer substrate processing device that processes substrates one by one is described. The substrate processing device includes a chemical liquid preparation unit configured to prepare a chemical liquid supplied to a substrate and a processing unit configured to supply a chemical liquid prepared by the chemical liquid preparation unit to a substrate. The chemical liquid preparation unit dissolves the oxygen-containing gas in the TMAH-containing chemical liquid by supplying an oxygen-containing gas which contains oxygen gas to a TMAH-containing chemical liquid which contains TMAH. A dissolved oxygen concentration in the chemical liquid increases by dissolving the oxygen-containing gas in the TMAH-containing chemical liquid. In addition, the chemical liquid preparation unit dissolves the inert-gas-containing gas in the TMAH-containing chemical liquid by supplying an inert-gas-containing gas which contains nitrogen gas to a TMAH-containing chemical liquid which contains TMAH. A dissolved oxygen concentration in the chemical liquid decreases by dissolving the inert-gas-containing gas in the TMAH-containing chemical liquid. In US 2013306238 A1, a dissolved oxygen concentration in the chemical liquid stored in a tank is measured by a dissolved gas sensor. When a value measured by the dissolved gas sensor is higher than a predetermined threshold concentration, an inert-gas-containing gas is supplied to the chemical liquid and the inert-gas-containing gas is dissolved in the chemical liquid. When a value measured by the dissolved gas sensor is lower than a predetermined threshold concentration, an oxygen-containing gas is supplied to the chemical liquid and the oxygen-containing gas is dissolved in the chemical liquid. When the threshold concentration (target dissolved oxygen concentration) is feedback-controlled as a concentration corresponding to a desired etching rate, a dissolved oxygen concentration in the chemical liquid can be accurately adjusted to a threshold concentration (target dissolved oxygen concentration) corresponding to a desired etching rate. As a result, variation in a chemical liquid treatment between substrates or between substrate processing devices is reduced.

The method described in US 2013306238 A1 is suitable when a dissolved oxygen concentration in a target chemical liquid is close to a target dissolved oxygen concentration (a target dissolved oxygen concentration corresponding to a desired etching rate). However, when a dissolved oxygen concentration in a target chemical liquid is far away from a target dissolved oxygen concentration (such as extremely high), even if it is attempted to bring a dissolved oxygen concentration close to a desired dissolved oxygen concentration according to feedback control as described in US 2013306238 A1, a dissolved oxygen concentration in the chemical liquid may not be able to be brought close to a desired dissolved oxygen concentration in a short period.

Specifically, in order to bring a dissolved oxygen concentration in the chemical liquid close to a desired dissolved oxygen concentration in a short period, increasing flow rates of an oxygen-containing gas supplied to the chemical liquid and an inert-gas-containing gas supplied to the chemical liquid can be considered. However, when flow rates of an oxygen-containing gas supplied to the chemical liquid and an inert-gas-containing gas supplied to the chemical liquid are increased, depending on the responsiveness of the dissolved gas sensor, feedback control may overshoot (such as when the responsiveness of the dissolved gas sensor is poor), and as a result, there is a risk of a dissolved oxygen concentration in the chemical liquid not being brought close to a target dissolved oxygen concentration accurately. Thus, the inventors have conducted studies for preparation a chemical liquid maintained at a target dissolved oxygen concentration accurately without performing feedback control.

SUMMARY

Here, the present disclosure provides a chemical liquid preparation method and chemical liquid preparation device through which it is possible to prepare a chemical liquid maintained at a dissolved oxygen concentration such that a desired etching rate is obtained.

In addition, the present disclosure provides a substrate processing device that can process a substrate at a desired etching rate.

The present disclosure provides a chemical liquid preparation method of preparing a chemical liquid for treating a film formed on a substrate, including a gas dissolving process in which an oxygen-containing gas and an inert-gas-containing gas are dissolved in the chemical liquid by supplying the oxygen-containing gas which contains oxygen gas and the inert-gas-containing gas which contains an inert gas to a chemical liquid, wherein in the gas dissolving process, a dissolved oxygen concentration in the chemical liquid is adjusted by setting a mixing ratio between the oxygen-containing gas and the inert-gas-containing gas supplied to the chemical liquid as a mixing ratio corresponding to a predetermined target dissolved oxygen concentration.

The present disclosure provides chemical liquid preparation device configured to prepare a chemical liquid supplied to a film formed on a substrate in a processing unit, the device including: a tank in which a chemical liquid to be supplied to the processing unit is stored; and a gas dissolving unit configured to dissolve, in the chemical liquid stored in the tank, an oxygen-containing gas which contains oxygen gas and an inert-gas-containing gas which contains an inert gas in the chemical liquid, and in the gas dissolving unit, a dissolved oxygen concentration in the chemical liquid stored in the tank is adjusted by setting a mixing ratio between the oxygen-containing gas and the inert-gas-containing gas supplied to the chemical liquid as a mixing ratio corresponding to a predetermined target dissolved oxygen concentration.

The present disclosure provides a substrate processing device including a chemical liquid preparation device which is a device configured to prepare a chemical liquid, including a tank in which a chemical liquid to be supplied to a processing unit is stored; and a gas dissolving unit configured to dissolve, in the chemical liquid stored in the tank, an oxygen-containing gas which contains oxygen gas and an inert-gas-containing gas which contains an inert gas in the chemical liquid, and in the gas dissolving unit, a dissolved oxygen concentration in the chemical liquid stored in the tank is adjusted by setting a mixing ratio between the oxygen-containing gas and the inert-gas-containing gas supplied to the chemical liquid as a mixing ratio corresponding to a predetermined target dissolved oxygen concentration; and a processing unit configured to supply the chemical liquid prepared by the chemical liquid preparation device to a substrate.

The above and other aspect, features and effects in the present disclosure can be clearly understood from embodiments to be described with reference to the appended drawings.

DESCRIPTION OF THE EMBODIMENTS

Figure 1:
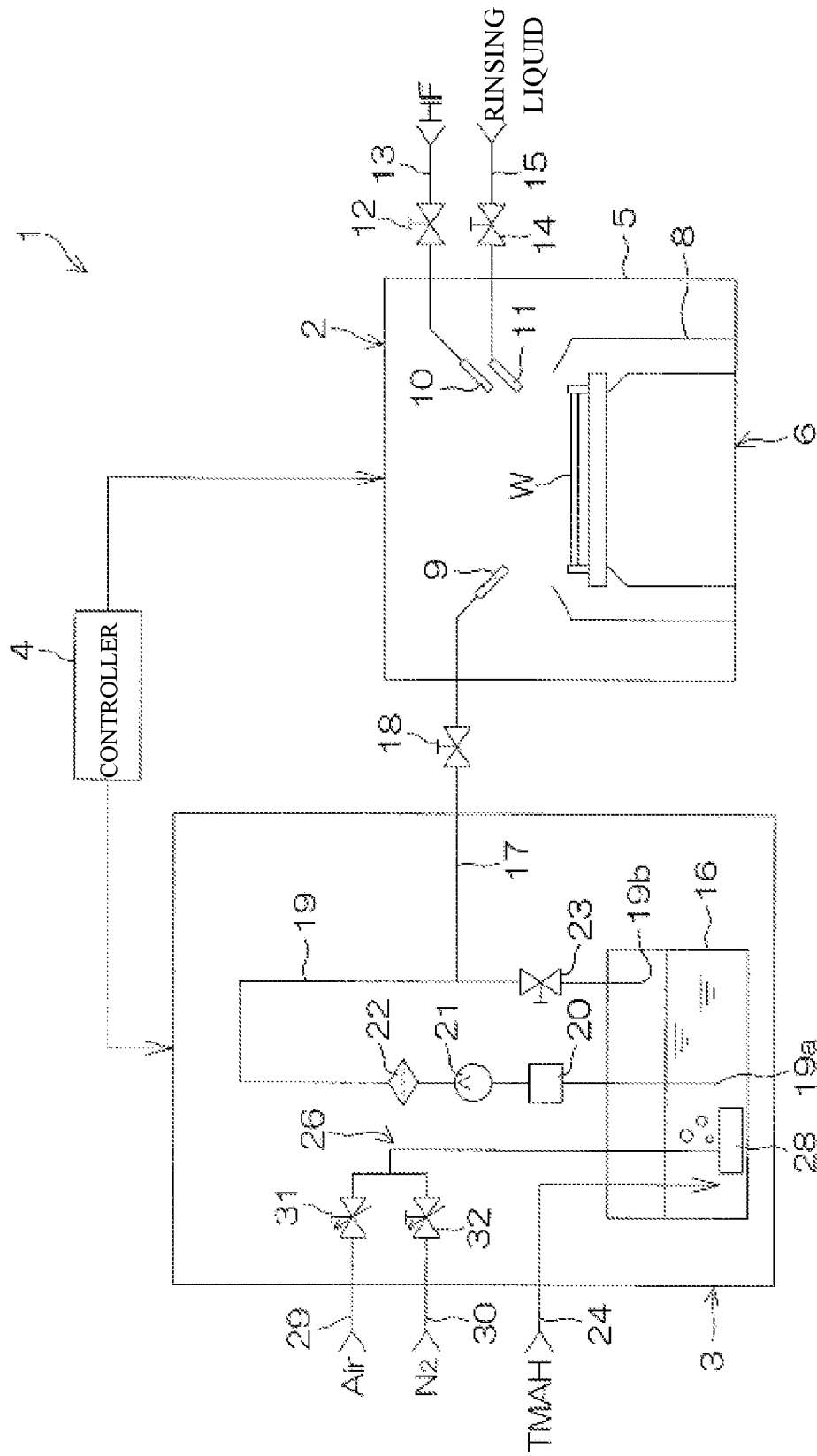
FIG. 1 is a diagram of a substrate processing device according to a first embodiment of the present disclosure when viewed in a horizontal direction.

The present disclosure provides a chemical liquid preparation method of preparing a chemical liquid for treating a film formed on a substrate, including a gas dissolving process in which an oxygen-containing gas and an inert-gas-containing gas are dissolved in the chemical liquid by supplying the oxygen-containing gas which contains oxygen gas and the inert-gas-containing gas which contains an inert gas to a chemical liquid, wherein in the gas dissolving process, a dissolved oxygen concentration in the chemical liquid is adjusted by setting a mixing ratio between the oxygen-containing gas and the inert-gas-containing gas supplied to the chemical liquid as a mixing ratio corresponding to a predetermined target dissolved oxygen concentration.

According to this method, the oxygen-containing gas and the inert-gas-containing gas are dissolved in the chemical liquid by supplying the oxygen-containing gas and the inert-gas-containing gas to the chemical liquid.

The inventors found that, when supply of an oxygen-containing gas and an inert-gas-containing gas at a predetermined ratio to the chemical liquid continues, a dissolved oxygen concentration in the chemical liquid converges at a certain concentration. In addition, the inventors found that, when a ratio (mixing ratio) of a supply flow rate of the oxygen-containing gas to a supply flow rate of the inert-gas-containing gas is relatively high, a dissolved oxygen concentration in the chemical liquid converges at a relatively high concentration and when a ratio (mixing ratio) of a supply flow rate of the oxygen-containing gas to a supply flow rate of the inert-gas-containing gas is relatively low, a dissolved oxygen concentration in the chemical liquid converges at a relatively low concentration.

In this case, when the oxygen-containing gas and the inert-gas-containing gas are supplied at a predetermined mixing ratio to the chemical liquid, and dissolving of the oxygen-containing gas and the inert-gas-containing gas in the chemical liquid continues, it is possible to adjust a dissolved oxygen concentration in the chemical liquid to a target dissolved oxygen concentration.

An etching rate of the chemical liquid depends on a dissolved oxygen concentration in the chemical liquid. In order to set an etching rate of the chemical liquid to a desired rate, it is necessary to adjust a dissolved oxygen concentration in the chemical liquid to a dissolved oxygen concentration (target dissolved oxygen concentration) corresponding to the rate. When a mixing ratio between an oxygen-containing gas and an inert-gas-containing gas supplied to the chemical liquid is set as a mixing ratio corresponding to a predetermined target dissolved oxygen concentration of the chemical liquid, it is possible to prepare a chemical liquid maintained at a target dissolved oxygen concentration (maintained at a dissolved oxygen concentration such that a desired etching rate is obtained).

In addition, supply of the oxygen-containing gas and supply of the inert-gas-containing gas may be performed together.

The chemical liquid to be prepared may be a TMAH-containing chemical liquid which contains tetramethylammonium hydroxide (TMAH).

In an embodiment of the present disclosure, the gas dissolving process includes a process in which bubbles are generated in the chemical liquid by discharging the oxygen-containing gas and the inert-gas-containing gas in the chemical liquid.

According to this method, since bubbles are generated in the chemical liquid by discharging an oxygen-containing gas and an inert-gas-containing gas, a mixing ratio between an oxygen-containing gas and an inert-gas-containing gas (a flow rate ratio between an oxygen-containing gas and an inert-gas-containing gas supplied to the chemical liquid) supplied to the chemical liquid can be very close to a dissolution ratio between an oxygen-containing gas and an inert-gas-containing gas in the chemical liquid (practically equal to each other). Since a mixing ratio between an oxygen-containing gas and an inert-gas-containing gas supplied to the chemical liquid and a dissolution ratio between an oxygen-containing gas and an inert-gas-containing gas in the chemical liquid can be regarded as the same, when a mixing ratio between an oxygen-containing gas and an inert-gas-containing gas supplied to the chemical liquid is controlled, it is possible to relatively easily control a dissolution ratio between an oxygen-containing gas and an inert-gas-containing gas in the chemical liquid. Accordingly, it is possible to prepare a chemical liquid in which a dissolved oxygen concentration remains at a predetermined target dissolved oxygen concentration with high accuracy.

In an embodiment of the present disclosure, the chemical liquid to be subjected to the gas dissolving process includes a chemical liquid recovered from a processing unit.

According to this method, the chemical liquid recovered from the processing unit has an extremely high dissolved oxygen concentration. It is necessary to prepare a chemical liquid in which a dissolved oxygen concentration remains at a desired concentration (low concentration) on the basis of the dissolved oxygen concentration of the chemical liquid. The method (feedback control) described in US 2013306238 A1 is unsuitable when a dissolved oxygen concentration in a target chemical liquid is extremely high.

Even if a dissolved oxygen concentration in the chemical liquid is extremely high, when supply of an oxygen-containing gas and an inert-gas-containing gas at a predetermined mixing ratio to the chemical liquid continues, the dissolved oxygen concentration in the chemical liquid can be adjusted to a target dissolved oxygen concentration. Accordingly, it is possible to prepare a chemical liquid in which a dissolved oxygen concentration remains at a desired concentration (low concentration) on the basis of the chemical liquid (chemical liquid in which a dissolved oxygen concentration is extremely high) recovered from the processing unit.

In another embodiment of the present disclosure, the gas dissolving process includes a first gas dissolving process in which a dissolved oxygen concentration in the chemical liquid is adjusted by setting a mixing ratio between the oxygen-containing gas and the inert-gas-containing gas supplied to the chemical liquid as a predetermined mixing ratio, and a second gas dissolving process in which a dissolved oxygen concentration in the chemical liquid is adjusted by setting a mixing ratio between the oxygen-containing gas and the inert-gas-containing gas supplied to the chemical liquid as a mixing ratio for the target dissolved oxygen concentration in the chemical liquid obtained after gas is dissolved by the first gas dissolving process.

According to this method, since the gas dissolving process (dissolving of an oxygen-containing gas and an inert-gas-containing gas in the chemical liquid) is performed in stages, even if the chemical liquid to be subjected to the gas dissolving process is a chemical liquid having a concentration (for example, an extremely high concentration or an extremely low concentration) far away from a target dissolved oxygen concentration, it is possible to adjust a dissolved oxygen concentration in the chemical liquid to the target dissolved oxygen concentration. Accordingly, it is possible to prepare a chemical liquid in which a dissolved oxygen concentration remains at a desired concentration more suitably.

In another embodiment of the present disclosure, the mixing ratio of a supply flow rate of the oxygen-containing gas to a supply flow rate of the inert-gas-containing gas in the first gas dissolving process is the same as the mixing ratio of a supply flow rate of the oxygen-containing gas to a supply flow rate of the inert-gas-containing gas in the second gas dissolving process.

As described above, when a ratio of a supply flow rate of the oxygen-containing gas to a supply flow rate of the inert-gas-containing gas is high, a dissolved oxygen concentration in the chemical liquid converges at a relatively high concentration, and in the gas dissolving process, when a ratio of a supply flow rate of the oxygen-containing gas to a supply flow rate of the inert-gas-containing gas is low, a dissolved oxygen concentration in the chemical liquid converges at a relatively low concentration.

According to this method, since a ratio of a supply flow rate of the oxygen-containing gas to a supply flow rate of the inert-gas-containing gas in the first gas dissolving process is the same as a ratio of a supply flow rate of the oxygen-containing gas to a supply flow rate of the inert-gas-containing gas in the second gas dissolving process, a target dissolved oxygen concentration in the first gas dissolving process and a target dissolved oxygen concentration in the second gas dissolving process are the same. Accordingly, a dissolved oxygen concentration in the chemical liquid can be adjusted to a final target dissolved oxygen concentration with higher accuracy.

In another embodiment of the present disclosure, the mixing ratio of a supply flow rate of the oxygen-containing gas to a supply flow rate of the inert-gas-containing gas in the first gas dissolving process is lower than the mixing ratio of a supply flow rate of the oxygen-containing gas to a supply flow rate of the inert-gas-containing gas in the second gas dissolving process.

As described above, when a ratio of a supply flow rate of the oxygen-containing gas to a supply flow rate of the inert-gas-containing gas is high, a dissolved oxygen concentration in the chemical liquid converges at a relatively high concentration, and in the gas dissolving process, when a ratio of a supply flow rate of the oxygen-containing gas to a supply flow rate of the inert-gas-containing gas is low, a dissolved oxygen concentration in the chemical liquid converges at a relatively low concentration.

According to this method, since a ratio of a supply flow rate of the oxygen-containing gas to a supply flow rate of the inert-gas-containing gas in the first gas dissolving process is lower than a ratio of a supply flow rate of the oxygen-containing gas to a supply flow rate of the inert-gas-containing gas in the second gas dissolving process, a target dissolved oxygen concentration in the first gas dissolving process is lower than a target dissolved oxygen concentration in the second gas dissolving process. Accordingly, a dissolved oxygen concentration in the chemical liquid can be brought close to a final target dissolved oxygen concentration within a shorter period.

In another embodiment of the present disclosure, the chemical liquid preparation method further includes a measurement process in which a dissolved oxygen concentration in the chemical liquid obtained after gas is dissolved by the gas dissolving process is measured; an inert gas dissolving process in which, when the dissolved oxygen concentration measured in the measurement process is higher than the target dissolved oxygen concentration, the inert-gas-containing gas is dissolved in the chemical liquid obtained after gas is dissolved by the gas dissolving process by supplying the inert-gas-containing gas to the chemical liquid obtained after gas is dissolved by the gas dissolving process; and an oxygen-containing gas dissolving process in which, when the dissolved oxygen concentration measured in the measurement process is lower than the target dissolved oxygen concentration, the oxygen-containing gas is dissolved in the chemical liquid obtained after gas is dissolved by the gas dissolving process by supplying the oxygen-containing gas to the chemical liquid obtained after gas is dissolved by the gas dissolving process.

According to this method, a gas supplied to the chemical liquid obtained after gas is dissolved by the gas dissolving process is switched according to a dissolved oxygen concentration in the chemical liquid. That is, one of the oxygen-containing gas and the inert-gas-containing gas is supplied to the TMAH-containing chemical liquid to feedback according to a dissolved oxygen concentration in the chemical liquid. Accordingly, a dissolved oxygen concentration in the chemical liquid can be adjusted to a certain concentration with high accuracy.

Such feedback control is performed on the chemical liquid obtained after gas is dissolved by, that is, the chemical liquid in which a dissolved oxygen concentration is sufficiently close to a target dissolved oxygen concentration. When a dissolved oxygen concentration in the chemical liquid is sufficiently close to a target dissolved oxygen concentration, a dissolved oxygen concentration in the chemical liquid can be adjusted to a target dissolved oxygen concentration with high accuracy according to feedback control.

The present disclosure provides chemical liquid preparation device configured to prepare a chemical liquid supplied to a film formed on a substrate in a processing unit, the device including: a tank in which a chemical liquid to be supplied to the processing unit is stored; and a gas dissolving unit configured to dissolve, in the chemical liquid stored in the tank, an oxygen-containing gas which contains oxygen gas and an inert-gas-containing gas which contains an inert gas in the chemical liquid, and in the gas dissolving unit, a dissolved oxygen concentration in the chemical liquid stored in the tank is adjusted by setting a mixing ratio between the oxygen-containing gas and the inert-gas-containing gas supplied to the chemical liquid as a mixing ratio corresponding to a predetermined target dissolved oxygen concentration.

In such a configuration, the oxygen-containing gas and the inert-gas-containing gas are dissolved in the chemical liquid by supplying the oxygen-containing gas and the inert-gas-containing gas to the chemical liquid.

The inventors found that, when supply of an oxygen-containing gas and an inert-gas-containing gas at a predetermined ratio to the chemical liquid continues, a dissolved oxygen concentration in the chemical liquid converges at a certain concentration. In addition, the inventors found that, when a ratio (mixing ratio) of a supply flow rate of the oxygen-containing gas to a supply flow rate of the inert-gas-containing gas is relatively high, a dissolved oxygen concentration in the chemical liquid converges at a relatively high concentration and when a ratio (mixing ratio) of a supply flow rate of the oxygen-containing gas to a supply flow rate of the inert-gas-containing gas is relatively low, a dissolved oxygen concentration in the chemical liquid converges at a relatively low concentration.

In this case, when the oxygen-containing gas and the inert-gas-containing gas are supplied at a predetermined mixing ratio to the chemical liquid, and dissolving of the oxygen-containing gas and the inert-gas-containing gas in the chemical liquid continues, it is possible to adjust a dissolved oxygen concentration in the chemical liquid to a target dissolved oxygen concentration.

An etching rate of the chemical liquid depends on a dissolved oxygen concentration in the chemical liquid. In order to set an etching rate of the chemical liquid to a desired rate, it is necessary to adjust a dissolved oxygen concentration in the chemical liquid to a dissolved oxygen concentration (target dissolved oxygen concentration) corresponding to the rate. When a mixing ratio between an oxygen-containing gas and an inert-gas-containing gas supplied to the chemical liquid is set as a mixing ratio corresponding to a predetermined target dissolved oxygen concentration of the chemical liquid, it is possible to prepare a chemical liquid maintained at a target dissolved oxygen concentration (maintained at a dissolved oxygen concentration such that a desired etching rate is obtained).

In addition, supply of the oxygen-containing gas and supply of the inert-gas-containing gas may be performed together.

In addition, the chemical liquid to be prepared may include a TMAH-containing chemical liquid which contains tetramethylammonium hydroxide (TMAH).

In an embodiment of the present disclosure, the gas dissolving unit includes a bubbling unit configured to generate bubbles in the chemical liquid by discharging the oxygen-containing gas and the inert-gas-containing gas from a gas discharge port disposed in the chemical liquid stored in the tank.

In such a configuration, since bubbles are generated in the chemical liquid by discharging an oxygen-containing gas and an inert-gas-containing gas, a mixing ratio between an oxygen-containing gas and an inert-gas-containing gas supplied to the chemical liquid can be very close to a dissolution ratio between an oxygen-containing gas and an inert-gas-containing gas in the chemical liquid (practically equal to each other). Since a mixing ratio between an oxygen-containing gas and an inert-gas-containing gas supplied to the chemical liquid and a dissolution ratio between an oxygen-containing gas and an inert-gas-containing gas in the chemical liquid can be regarded as the same, when a mixing ratio between an oxygen-containing gas and an inert-gas-containing gas supplied to the chemical liquid is controlled, it is possible to relatively easily control a dissolution ratio between an oxygen-containing gas and an inert-gas-containing gas in the chemical liquid. Accordingly, it is possible to prepare a chemical liquid in which a dissolved oxygen concentration remains at a predetermined target dissolved oxygen concentration with high accuracy.

In an embodiment of the present disclosure, a chemical liquid recovered from the processing unit is stored in the tank.

In such a configuration, the chemical liquid recovered from the processing unit has an extremely high dissolved oxygen concentration. The method (feedback control) described in US 2013306238 A1 is unsuitable when a dissolved oxygen concentration in a target chemical liquid is extremely high.

However, even if a dissolved oxygen concentration in the chemical liquid is extremely high, when supply of an oxygen-containing gas and an inert-gas-containing gas at a predetermined mixing ratio to the chemical liquid continues, the dissolved oxygen concentration in the chemical liquid can be adjusted to a target dissolved oxygen concentration. Accordingly, it is possible to prepare a chemical liquid in which a dissolved oxygen concentration remains at a desired concentration (low concentration) on the basis of the chemical liquid (chemical liquid in which a dissolved oxygen concentration is extremely high) recovered from the processing unit.

In another embodiment of the present disclosure, in the chemical liquid preparation device, the tank includes a first tank, the gas dissolving unit includes a first gas dissolving unit configured to dissolve an oxygen-containing gas and an inert-gas-containing gas in the chemical liquid by supplying the oxygen-containing gas which contains oxygen gas and the inert-gas-containing gas which contains an inert gas to the chemical liquid stored in the first tank, wherein in the first gas dissolving unit, a dissolved oxygen concentration in the chemical liquid stored in the first tank is adjusted by setting a mixing ratio between the oxygen-containing gas and the inert-gas-containing gas supplied to the chemical liquid as a predetermined mixing ratio, the tank further includes a second tank in which the chemical liquid obtained after gas is dissolved by the first gas dissolving unit is stored, and the gas dissolving unit further includes a second gas dissolving unit configured to dissolve the oxygen-containing gas and the inert-gas-containing gas in the chemical liquid by supplying the oxygen-containing gas and the inert-gas-containing gas to the chemical liquid stored in the second tank, wherein in the second gas dissolving unit, a dissolved oxygen concentration in the chemical liquid stored in the second tank is adjusted by setting a mixing ratio between the oxygen-containing gas and the inert-gas-containing gas supplied to the chemical liquid as a mixing ratio corresponding to the target dissolved oxygen concentration.

In such a configuration, since the gas dissolving process (dissolving of an oxygen-containing gas and an inert-gas-containing gas in the chemical liquid) is performed in stages, even if the chemical liquid to be subjected to the gas dissolving process is a chemical liquid having a concentration (for example, an extremely high concentration or an extremely low concentration) far away from target dissolved oxygen concentration, it is possible to adjust a dissolved oxygen concentration in the chemical liquid to the target dissolved oxygen concentration. Accordingly, it is possible to prepare a chemical liquid in which a dissolved oxygen concentration remains at a desired concentration more suitably.

In another embodiment of the present disclosure, the mixing ratio which is a ratio of a supply flow rate of the oxygen-containing gas to a supply flow rate of the inert-gas-containing gas in the first gas dissolving unit is the same as the mixing ratio which is a ratio of a supply flow rate of the oxygen-containing gas to a supply flow rate of the inert-gas-containing gas in the second gas dissolving unit.

As described above, when a ratio of a supply flow rate of the oxygen-containing gas to a supply flow rate of the inert-gas-containing gas is high, a dissolved oxygen concentration in the chemical liquid converges at a relatively high concentration, and in the gas dissolving process, when a ratio of a supply flow rate of the oxygen-containing gas to a supply flow rate of the inert-gas-containing gas is low, a dissolved oxygen concentration in the chemical liquid converges at a relatively low concentration.

In such a configuration, since a ratio of a supply flow rate of the oxygen-containing gas to a supply flow rate of the inert-gas-containing gas in the first gas dissolving process is the same as a ratio of a supply flow rate of the oxygen-containing gas to a supply flow rate of the inert-gas-containing gas in the second gas dissolving process, a target dissolved oxygen concentration in the first gas dissolving process and a target dissolved oxygen concentration in the second gas dissolving process are the same. Accordingly, a dissolved oxygen concentration in the chemical liquid can be adjusted to a final target dissolved oxygen concentration with higher accuracy.

In another embodiment of the present disclosure, the mixing ratio which is a ratio of a supply flow rate of the oxygen-containing gas to a supply flow rate of the inert-gas-containing gas in the first gas dissolving unit is higher than the mixing ratio which is a ratio of a supply flow rate of the oxygen-containing gas to a supply flow rate of the inert-gas-containing gas in the second gas dissolving unit.

In such a configuration, since a ratio of a supply flow rate of the oxygen-containing gas to a supply flow rate of the inert-gas-containing gas in the first gas dissolving process is lower than a ratio of a supply flow rate of the oxygen-containing gas to a supply flow rate of the inert-gas-containing gas in the second gas dissolving process, a target dissolved oxygen concentration in the first gas dissolving process is lower than a target dissolved oxygen concentration in the second gas dissolving process. Accordingly, a dissolved oxygen concentration in the chemical liquid can be brought close to a final target dissolved oxygen concentration within a shorter period.

In another embodiment of the present disclosure, the chemical liquid preparation device further includes a third tank in which the chemical liquid obtained after gas is dissolved by the gas dissolving unit is stored; a measurement unit configured to measure a dissolved oxygen concentration in the chemical liquid stored in the third tank; an inert gas dissolving unit configured to dissolve the inert-gas-containing gas in the chemical liquid by supplying the inert-gas-containing gas to the chemical liquid stored in the third tank at the same time; an oxygen gas dissolving unit configured to dissolve the oxygen-containing gas in the chemical liquid by supplying the oxygen-containing gas to the chemical liquid stored in the third tank at the same time; and a controller configured to control the measurement unit, the inert gas dissolving unit and the oxygen gas dissolving unit. Thus, the controller may perform a measurement process in which a dissolved oxygen concentration in the chemical liquid stored in the third tank is measured by the measurement unit; an inert gas dissolving process in which, when the dissolved oxygen concentration measured in the measurement process is higher than the target dissolved oxygen concentration, the inert-gas-containing gas is dissolved in the chemical liquid stored in the third tank; and an oxygen-containing gas dissolving process in which, when the dissolved oxygen concentration measured in the measurement process is lower than the target dissolved oxygen concentration, the oxygen-containing gas is dissolved in the chemical liquid stored in the third tank.

In such a configuration, a gas supplied to the chemical liquid obtained after gas is dissolved by the gas dissolving process is switched according to a dissolved oxygen concentration in the chemical liquid. That is, one of the oxygen-containing gas and the inert-gas-containing gas is supplied to the TMAH-containing chemical liquid to feedback according to a dissolved oxygen concentration in the chemical liquid. Accordingly, a dissolved oxygen concentration in the chemical liquid can be adjusted to a certain concentration with high accuracy.

Such feedback control is performed on the chemical liquid obtained after gas is dissolved, that is, the chemical liquid in which a dissolved oxygen concentration is sufficiently close to a target dissolved oxygen concentration. When a dissolved oxygen concentration in the chemical liquid is sufficiently close to a target dissolved oxygen concentration, a dissolved oxygen concentration in the chemical liquid can be adjusted to a target dissolved oxygen concentration with high accuracy according to feedback control.

The present disclosure provides a substrate processing device including a chemical liquid preparation device which is a device configured to prepare a chemical liquid, including a tank in which a chemical liquid to be supplied to a processing unit is stored; and a gas dissolving unit configured to dissolve, in the chemical liquid stored in the tank, an oxygen-containing gas which contains oxygen gas and an inert-gas-containing gas which contains an inert gas in the chemical liquid, and in the gas dissolving unit, a dissolved oxygen concentration in the chemical liquid stored in the tank is adjusted by setting a mixing ratio between the oxygen-containing gas and the inert-gas-containing gas supplied to the chemical liquid as a mixing ratio corresponding to a predetermined target dissolved oxygen concentration; and a processing unit configured to supply the chemical liquid prepared by the chemical liquid preparation device to a substrate.

In such a configuration, the oxygen-containing gas and the inert-gas-containing gas are dissolved in the chemical liquid by supplying the oxygen-containing gas and the inert-gas-containing gas are supplied to the chemical liquid.

The inventors found that, when supply of an oxygen-containing gas and an inert-gas-containing gas at a predetermined ratio to the chemical liquid continues, a dissolved oxygen concentration in the chemical liquid converges at a certain concentration. In addition, the inventors found that, when a ratio (mixing ratio) of a supply flow rate of the oxygen-containing gas to a supply flow rate of the inert-gas-containing gas is relatively high, a dissolved oxygen concentration in the chemical liquid converges at a relatively high concentration and when a ratio (mixing ratio) of a supply flow rate of the oxygen-containing gas to a supply flow rate of the inert-gas-containing gas is relatively low, a dissolved oxygen concentration in the chemical liquid converges at a relatively low concentration.

In this case, when the oxygen-containing gas and the inert-gas-containing gas are supplied at a predetermined mixing ratio to the chemical liquid, and dissolving of the oxygen-containing gas and the inert-gas-containing gas in the chemical liquid continues, it is possible to adjust a dissolved oxygen concentration in the chemical liquid to a desired concentration.

An etching rate of the chemical liquid depends on a dissolved oxygen concentration in the chemical liquid. In order to set an etching rate of the chemical liquid to a desired rate, it is necessary to adjust a dissolved oxygen concentration in the chemical liquid to a dissolved oxygen concentration (target dissolved oxygen concentration) corresponding to the rate. When a mixing ratio between an oxygen-containing gas and an inert-gas-containing gas supplied to the chemical liquid is set as a mixing ratio corresponding to a predetermined target dissolved oxygen concentration of the chemical liquid, it is possible to prepare a chemical liquid maintained at a target dissolved oxygen concentration (maintained at a dissolved oxygen concentration such that a desired etching rate is obtained).

In addition, supply of the oxygen-containing gas and supply of the inert-gas-containing gas may be performed together.

In this manner, since it is possible to process a substrate using a chemical liquid maintained at a target dissolved oxygen concentration (maintained at a dissolved oxygen concentration such that a desired etching rate is obtained), it is possible to process the substrate at a desired etching rate.

First Embodiment

FIG. 1 is a diagram of a substrate processing device according to a first embodiment of the present disclosure when viewed in a horizontal direction.

As shown in FIG. 1, a substrate processing device 1 includes a processing unit 2 configured to process a substrate (for example, silicon substrate) W using a processing liquid such as a chemical liquid or a rinsing liquid, a chemical liquid preparation unit (chemical liquid preparation device) 3 as a chemical liquid preparation unit configured to supply TMAH (TMAH-containing chemical liquid, aqueous solution) which is an example of a chemical liquid to the processing unit 2, and a controller 4 configured to control opening and closing of a device or a valve provided in the substrate processing device 1.

The processing unit 2 and the chemical liquid preparation unit 3 may be parts of a common device or may be independent units (units that can move independently from each other). That is, in the substrate processing device 1, the chemical liquid preparation unit 3 may be disposed in the outer wall of the substrate processing device 1 and may be covered with the outer wall or may be disposed outside the outer wall of the substrate processing device 1. When the chemical liquid preparation unit 3 is disposed outside the outer wall, it may be disposed on the side of the substrate processing device 1 or may be disposed below (underground) a clean room in which the substrate processing device 1 is deployed.

In addition, the processing unit 2 is a single-wafer unit configured to process substrates W one by one or a batch type unit configured to process a plurality of substrates W collectively. FIG. 1 shows an example in which the processing unit 2 is a single-wafer unit.

The process performed by the processing unit 2 may include an etching process in which an etching liquid is supplied to a substrate W with an outermost layer on which a target film such as a polysilicon film (poly-Si film) is formed or may include a developing process in which a developing liquid is supplied to the substrate W after exposure.

The processing unit 2 includes a box-type chamber 5, a spin chuck 6 that holds the substrate W horizontally in the chamber 5 and rotates the substrate W around a vertical axis that passes through the center of the substrate W, and a processing liquid nozzle through which a processing liquid such as a chemical liquid or a rinsing liquid is discharged toward the substrate W. In addition, the processing unit 2 includes a cylindrical processing cup 8 that surrounds the spin chuck 6. The processing liquid nozzle includes chemical liquid nozzles (a first chemical liquid nozzle 9 and a second chemical liquid nozzle 10) through which a chemical liquid is discharged toward an upper surface of the substrate W and a rinsing liquid nozzle 11 through which a rinsing liquid is discharged toward an upper surface of the substrate W.

As shown in FIG. 1, the first chemical liquid nozzle 9 is connected to the chemical liquid preparation unit 3. TMAH (TMAH-containing chemical liquid, aqueous solution) which is an example of a chemical liquid is supplied to the first chemical liquid nozzle 9 from the chemical liquid preparation unit 3. TMAH is an example of an organic alkali. TMAH is an example of an etching liquid and a developing liquid. TMAH supplied to the first chemical liquid nozzle 9 may or may not contain a surfactant.

The second chemical liquid nozzle 10 is connected to a second chemical liquid piping 13 into which a second chemical liquid valve 12 is inserted. The second chemical liquid piping 13 supplies hydrofluoric acid from a hydrofluoric acid supply source to the second chemical liquid nozzle 10.

The rinsing liquid nozzle 11 is connected to a rinsing liquid piping 15 into which a rinsing liquid valve 14 is inserted. In the rinsing liquid piping 15, a rinsing liquid from a rinsing liquid supply source is supplied to the rinsing liquid nozzle 11. The rinsing liquid supplied to the rinsing liquid nozzle 11 is, for example, pure water (deionized water). However, the rinsing liquid is not limited to pure water, and any of carbonated water, electrolytic ion water, hydrogen water, ozone water, ammonia water and hydrochloric acid water with a diluted concentration (for example, about 10 to 100 ppm) may be used.

In the processing unit 2, for example, an etching process in which hydrofluoric acid, a rinsing liquid, TMAH and a rinsing liquid in that order are sequentially supplied to the entire upper surface area of the substrate W is performed. Specifically, the controller 4 rotates the substrate W around the vertical axis while holding the substrate W horizontally by the spin chuck 6. In this state, the controller 4 opens the second chemical liquid valve 12 and discharges hydrofluoric acid toward the upper surface of the substrate W from the second chemical liquid nozzle 10. Hydrofluoric acid supplied to the substrate W spreads outward on the substrate W under a centrifugal force due to rotation of the substrate W and the entire upper surface area of the substrate W is treated with hydrofluoric acid (hydrofluoric acid treatment). The controller 4 opens the rinsing liquid valve 14 after discharge of hydrofluoric acid from the second chemical liquid nozzle 10 is stopped, and thus discharges pure water toward the upper surface of the substrate W that is rotating from the rinsing liquid nozzle 11. Accordingly, hydrofluoric acid on the substrate W is washed off with pure water (rinsing treatment).

Next, the controller 4 controls the chemical liquid preparation unit 3 such that TMAH is discharged from the first chemical liquid nozzle 9 toward the upper surface of the substrate W that is rotating. TMAH supplied to the substrate W spreads outward on the substrate W under a centrifugal force due to rotation of the substrate W and the entire upper surface area of the substrate W is treated with TMAH (TMAH treatment). The controller 4 opens the rinsing liquid valve 14 after discharge of TMAH from the first chemical liquid nozzle 9 is stopped, and thus discharges pure water from the rinsing liquid nozzle 11 toward the upper surface of the substrate W that is rotating. Accordingly, TMAH on the substrate W is washed off with pure water (rinsing treatment). Next, the controller 4 rotates the substrate W at a high speed by the spin chuck 6, and thus dries the substrate W (spin drying treatment). In this manner, a series of treatments are performed on the substrate W.

The chemical liquid preparation unit 3 includes a tank 16 in which TMAH is stored, a first chemical liquid piping 17 through which TMAH in the tank 16 is guided to the processing unit 2 (the first chemical liquid nozzle 9), a first chemical liquid valve 18 that opens and closes the inside of the first chemical liquid piping 17, a circulation piping 19 that connects the first chemical liquid piping 17 and the tank 16 on the side (the side of the tank 16) upstream from the first chemical liquid valve 18, a temperature adjusting unit 20 (a heating unit or a cooling unit) configured to adjust a temperature of TMAH that circulates in the circulation piping 19 to a desired liquid temperature, a liquid feeding pump 21 configured to feed TMAH in the tank 16 to the circulation piping 19, a filter 22 configured to remove foreign substances in TMAH that circulates in the circulation piping 19, a circulation valve 23 that opens and closes the inside of the circulation piping 19, and a replenishing piping 24 that replenishes the tank 16 with TMAH from a TMAH supply source.

An upstream end 19a and a downstream end 19b of the circulation piping 19 are connected to the tank 16. The circulation piping 19 includes a supply unit configured to draw up TMAH in the tank 16 and introduce it into the circulation piping 19, a connecting part to which an upstream end of the first chemical liquid piping 17 is connected, and a return unit configured to introduce TMAH that has passed through the connecting part to the tank 16.

When TMAH in the tank 16 is supplied to the processing unit 2, the first chemical liquid valve 18 is opened and the circulation valve 23 is closed. In this state, TMAH fed from the tank 16 to the first chemical liquid piping 17 by the liquid feeding pump 21 is supplied to the processing unit 2.

On the other hand, when supply of TMAH to the processing unit 2 is stopped, the circulation valve 23 is opened and the first chemical liquid valve 18 is closed. In this state, TMAH fed from the tank 16 to the supply unit of the circulation piping 19 by the liquid feeding pump 21 returns into the tank 16 through the return unit of the circulation piping 19. Therefore, during supply stoppage in which supply of TMAH to the processing unit 2 is stopped, TMAH continues to circulate through a circulation path formed by the tank 16, the first chemical liquid piping 17 and the circulation piping 19.

As shown in FIG. 1, the chemical liquid preparation unit 3 includes a gas dissolving unit 26 configured to supply a mixed gas of an oxygen-containing gas and an inert-gas-containing gas into the tank 16 and dissolve the oxygen-containing gas and the inert-gas-containing gas in TMAH in the tank 16.

The gas dissolving unit 26 includes a mixed gas piping 28 through which a mixed gas of an oxygen-containing gas and an inert-gas-containing gas is discharged into the tank (the tank 16), an oxygen-containing gas piping 29 through which an oxygen-containing gas from an oxygen-containing gas supply source is supplied to the mixed gas piping 28, and an inert-gas-containing gas piping 30 through which an inert-gas-containing gas from an inert-gas-containing gas supply source is supplied to the mixed gas piping 28. The inert-gas-containing gas may be nitrogen gas or a mixed gas of nitrogen gas and a gas other than nitrogen gas. Similarly, the oxygen-containing gas may be oxygen gas or a mixed gas of oxygen gas and a gas other than oxygen gas. Hereinafter, an example in which an inert-gas-containing gas is nitrogen gas which is an example of an inert gas and an oxygen-containing gas is dry air (dried clean air) containing nitrogen and oxygen at a ratio of about 8:2 will be described. In addition, the mixed gas piping 28 includes a bubbling piping through which a mixed gas of an oxygen-containing gas and an inert-gas-containing gas from a discharge port disposed in TMAH (in a liquid) is discharged and thus bubbles are generated in TMAH.

The gas dissolving unit 26 includes a mixing ratio adjusting unit configured to adjust a mixing ratio between an oxygen-containing gas and an inert-gas-containing gas in TMAH (supply flow rate ratio, specifically, a ratio of an oxygen-containing gas and an inert-gas-containing gas dissolved in TMAH) in the gas dissolving unit 26. The mixing ratio adjusting unit includes a first flow rate adjusting valve 31 that changes a flow rate of an oxygen-containing gas supplied from the oxygen-containing gas piping 29 to the mixed gas piping 28 and a second flow rate adjusting valve 32 that changes a flow rate of an inert-gas-containing gas supplied from the inert-gas-containing gas piping 30 to the mixed gas piping 28. The first flow rate adjusting valve 31 includes a valve body in which a valve seat is provided, a valve element that opens and closes the valve seat, and an actuator that moves the valve element between an open position and a closed position. This similarly applies to the other flow rate adjusting valve 32.

Figure 2:
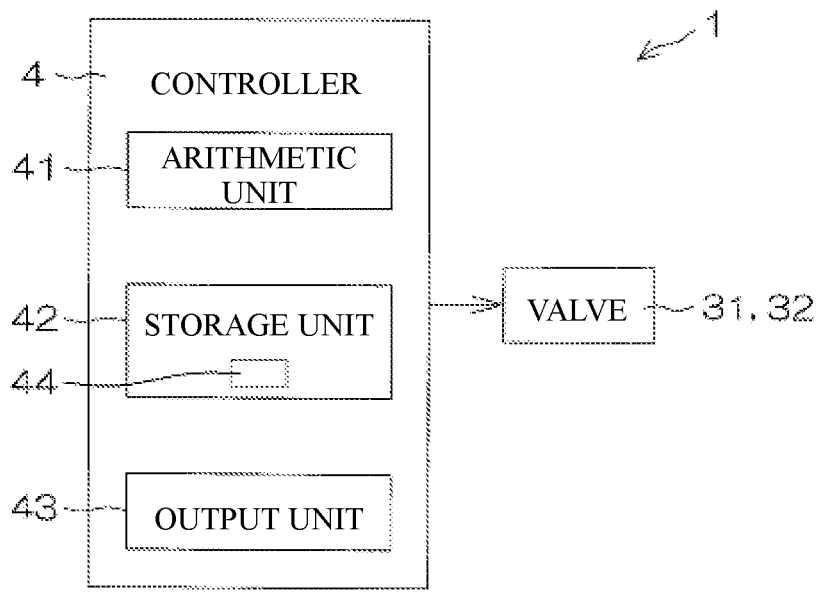
FIG. 2 is a block diagram for explaining an electrical configuration of the substrate processing device.
Figure 3A:
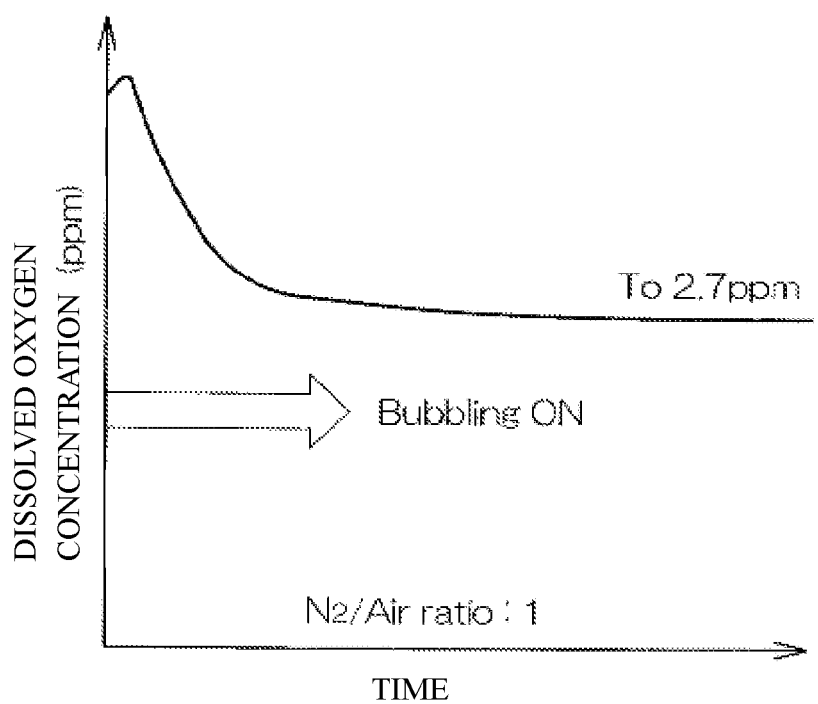
FIG. 3A is a diagram showing a change in a dissolved oxygen concentration in TMAH when a mixed gas in which dry air and nitrogen gas are mixed at a mixing ratio (supply flow rate ratio) of 1:1 is supplied.
Figure 3B:
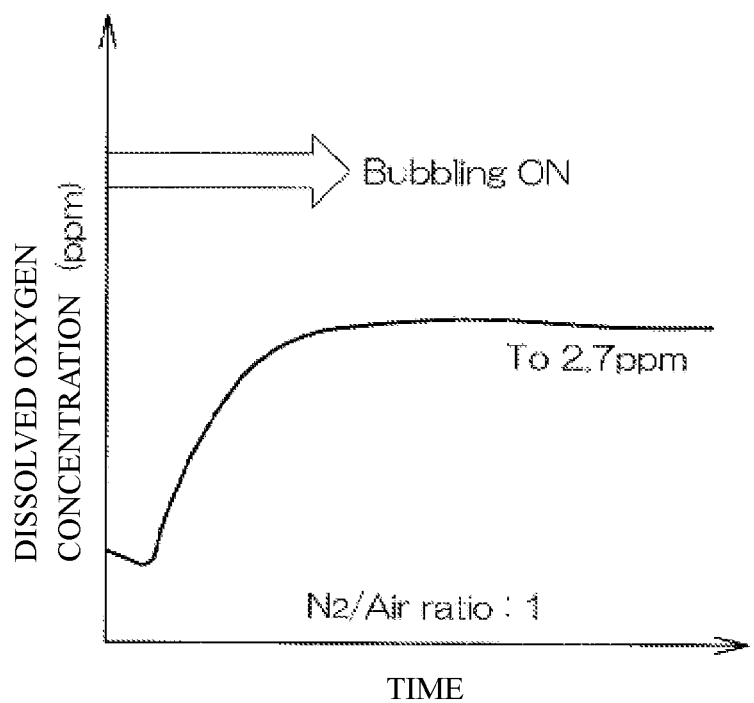
FIG. 3B is a diagram showing a change in a dissolved oxygen concentration in TMAH when a mixed gas in which dry air and nitrogen gas are mixed at a mixing ratio (supply flow rate ratio) of 1:1 is supplied.
Figure 3C:
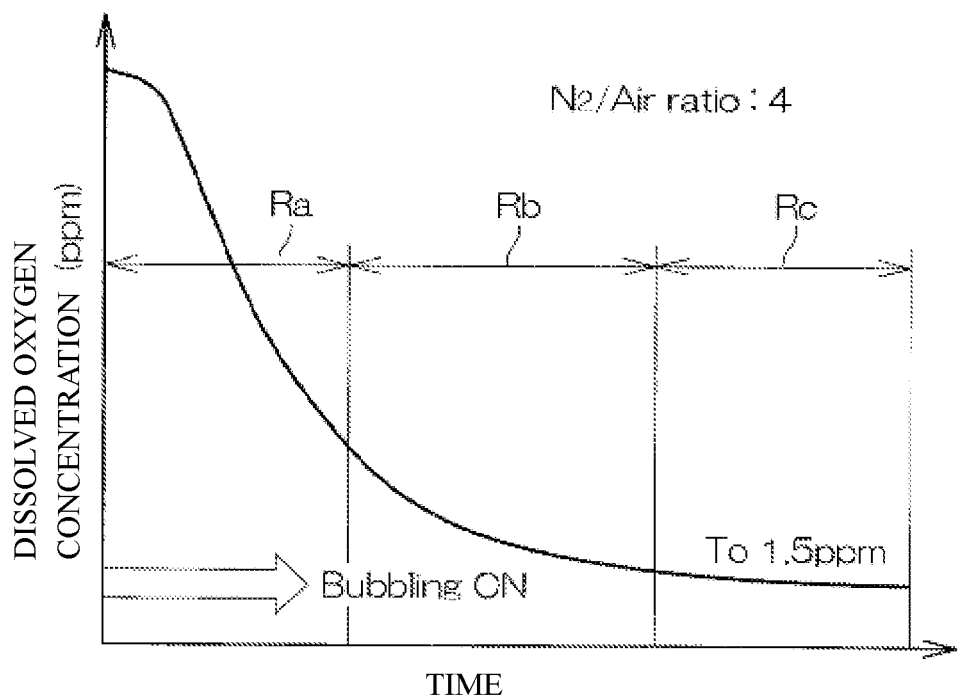
FIG. 3C is a diagram showing a change in a dissolved oxygen concentration in TMAH when a mixed gas in which dry air and nitrogen gas are mixed at a mixing ratio (supply flow rate ratio) of 1:4 is supplied.
Figure 4:
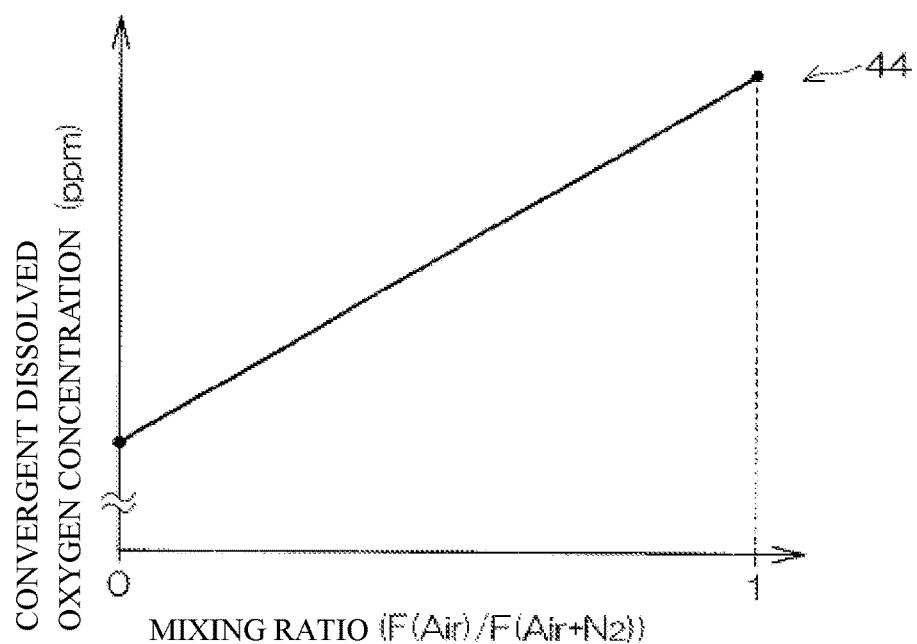
FIG. 4 is a diagram showing a correspondence relationship between a desired dissolved oxygen concentration in TMAH and a ratio of a supply flow rate of an oxygen-containing gas to a supply flow rate of an inert-gas-containing gas.

FIG. 2 is a block diagram for explaining an electrical configuration of the substrate processing device 1. FIG. 3A and FIG. 3B are diagrams showing a change in a dissolved oxygen concentration in TMAH when a mixed gas in which dry air and nitrogen gas are mixed at a mixing ratio (supply flow rate ratio) of 1:1 is supplied. FIG. 3C is a diagram showing a change in a dissolved oxygen concentration in TMAH when a mixed gas in which dry air and nitrogen gas are mixed at a mixing ratio (supply flow rate ratio) of 1:4 is supplied. FIG. 4 is a diagram showing a correspondence relationship between a desired dissolved oxygen concentration in TMAH and a supply flow rate ratio of an oxygen-containing gas to an inert-gas-containing gas. Here, a processing capacity of TMAH (for example, an etching amount per unit time, that is, an etching rate) varies according to a dissolved oxygen concentration in TMAH. That is, an etching rate of TMAH depends on a dissolved oxygen concentration (dissolved oxygen amount) in TMAH.

FIG. 3A and FIG. 3C show cases in which a dissolved oxygen concentration in TMAH before a mixed gas is supplied is high (about 4.6 ppm) and FIG. 3B shows a case in which a dissolved oxygen concentration in TMAH before a mixed gas is supplied is low (about 0.5 ppm).

As shown in FIG. 3A and FIG. 3B, when a mixing ratio between dry air and nitrogen gas is 1:1, a dissolved oxygen concentration in TMAH converges at about 2.7 ppm with the passage of time in both cases in which a dissolved oxygen concentration in TMAH before a mixed gas is supplied is high (about 4.6 ppm) and low (about 0.5 ppm).

On the other hand, as shown in FIG. 3C, when a mixing ratio between dry air and nitrogen gas is 1:4, a dissolved oxygen concentration in TMAH converges at about 1.5 ppm with the passage of time.

Therefore, it can be understood from FIG. 3A and FIG. 3B that, when supply of an oxygen-containing gas and an inert-gas-containing gas at a predetermined ratio to TMAH continues, a dissolved oxygen concentration in TMAH converges at a certain concentration. In addition, it can be understood from FIG. 3A and FIG. 3C that, when a ratio of a supply flow rate of an oxygen-containing gas to a supply flow rate of an inert-gas-containing gas is relatively high, a dissolved oxygen concentration in TMAH converges at a relatively high concentration, and when a ratio of a supply flow rate of an oxygen-containing gas to a supply flow rate of an inert-gas-containing gas is relatively low, a dissolved oxygen concentration in TMAH converges at a relatively low concentration.

In addition, the inventors conducted various experiments by changing a flow rate, and found that a convergent dissolved oxygen concentration in TMAH is determined by a ratio (mixing ratio) of supply flow rates of an oxygen-containing gas and an inert-gas-containing gas regardless of actual flow rates of the oxygen-containing gas and the inert-gas-containing gas. Here, as described above, an etching rate of TMAH depends on a dissolved oxygen concentration (dissolved oxygen amount) in TMAH. As shown in FIG. 2, the controller 4 is constituted using, for example, a microcomputer. The controller 4 includes an arithmetic unit 41 such as a CPU, a storage unit 42 such as a fixed memory device (not shown) and a hard disk drive, an output unit 43 and an input unit (not shown). In the storage unit 42, a program that the arithmetic unit 41 executes is stored.

The storage unit 42 includes a nonvolatile memory that can electrically rewrite data. The storage unit 42 stores a concentration (a concentration of TMAH corresponding to a desired etching rate) of TMAH to be supplied to the substrate W. In addition, the storage unit 42 stores a correspondence relationship 44 between information about a supply flow rate ratio between an oxygen-containing gas and an inert-gas-containing gas and a dissolved oxygen concentration (convergent dissolved oxygen concentration) in TMAH that is converged to when an oxygen-containing gas and an inert-gas-containing gas are supplied at the flow rate ratio.

The correspondence relationship 44 may be stored in the form of a table, in the form of a map, or in the form of a graph (that is, an expression).

FIG. 4 shows an example of the correspondence relationship 44. In FIG. 4, the correspondence relationship 44 is a correspondence relationship between a ratio ($F(Air)/F(Air+N_2)$) of a supply flow rate of an oxygen-containing gas to a supply flow rate of an oxygen-containing gas and an inert-gas-containing gas, and a convergent dissolved oxygen concentration. Both have a linear function relationship, and a convergent dissolved oxygen concentration increases as a ratio of a supply flow rate of an oxygen-containing gas to a supply flow rate of an oxygen-containing gas and an inert-gas-containing gas increases. The correspondence relationship 44 is not limited to this form and may be a correspondence relationship between a ratio of a supply flow rate of an inert-gas-containing gas to a supply flow rate of an oxygen-containing gas and an inert-gas-containing gas and a convergent dissolved oxygen concentration. In addition, the correspondence relationship 44 may be a ratio of a supply flow rate of an oxygen-containing gas to a supply flow rate of an inert-gas-containing gas or may be a ratio of a supply flow rate of an inert-gas-containing gas to a supply flow rate of an oxygen-containing gas.

The liquid feeding pump 21, the temperature adjusting unit 20, and the like as control objects are connected to the controller 4. In addition, the first chemical liquid valve 18, the second chemical liquid valve 12, the rinsing liquid valve 14, the first flow rate adjusting valve 31, the second flow rate adjusting valve 32, and the like as control objects are connected to the controller 4.

In this embodiment, adjustment of a dissolved oxygen concentration in TMAH stored in the tank 16 (gas dissolving process) will be described. The controller 4 controls the gas dissolving unit 26 such that a mixed gas containing an oxygen-containing gas and an inert-gas-containing gas is supplied to the mixed gas piping 28. Accordingly, the mixed gas piping 28 discharges a mixed gas of an oxygen-containing gas and an inert-gas-containing gas from a discharge port disposed in TMAH (in a liquid), and accordingly, mixed gas bubbles are generated in TMAH. Accordingly, an oxygen-containing gas and an inert-gas-containing gas are dissolved in TMAH. Here, as described above, an etching rate of TMAH depends on a dissolved oxygen concentration (dissolved oxygen amount) in TMAH.

In addition, the controller 4 controls the mixing ratio adjusting unit (the first flow rate adjusting valve 31 and the second flow rate adjusting valve 32) and adjusts a flow rate ratio between an oxygen-containing gas and an inert-gas-containing gas contained in a mixed gas supplied to TMAH (accordingly, a dissolution ratio between an oxygen-containing gas and an inert-gas-containing gas in TMAH is adjusted). Specifically, the controller 4 acquires a concentration of TMAH (a concentration of TMAH corresponding to a desired etching rate) supplied to the substrate W from the storage unit 42. In addition, the controller 4 refers to the correspondence relationship 44 between a supply flow rate ratio (mixing ratio) of an oxygen-containing gas and an inert-gas-containing gas and a convergent dissolved oxygen concentration in the storage unit 42 and acquires a supply flow rate ratio between an oxygen-containing gas and an inert-gas-containing gas when a concentration of TMAH (a concentration of TMAH corresponding to a desired etching rate) supplied to the substrate W is set as a target dissolved oxygen concentration (that is, a convergent dissolved oxygen concentration). Then, the controller 4 adjusts degrees of opening of the first and second flow rate adjusting valves 31 and 32 so that the acquired supply flow rate ratio is reached. Accordingly, a mixing ratio (that is, a supply flow rate ratio between an oxygen-containing gas and an inert-gas-containing gas) of a mixed gas with which bubbles are generated in TMAH is adjusted. Since an oxygen-containing gas and an inert-gas-containing gas are discharged and bubbles are generated in TMAH, a mixing ratio of a mixed gas with which bubbles are generated in TMAH can be very close to a dissolution ratio between an oxygen-containing gas and an inert-gas-containing gas in TMAH (practically equal to each other). Since a mixing ratio (flow rate ratio) of an oxygen-containing gas and an inert-gas-containing gas supplied to TMAH and a dissolution ratio between an oxygen-containing gas and an inert-gas-containing gas in TMAH can be regarded as the same, when a mixing ratio between an oxygen-containing gas and an inert-gas-containing gas supplied to TMAH is controlled, it is possible to relatively easily control a dissolution ratio between an oxygen-containing gas and an inert-gas-containing gas in TMAH. Accordingly, it is possible to prepare TMAH in which a dissolved oxygen concentration remains at a predetermined target dissolved oxygen concentration with high accuracy.

Here, the responsiveness of a dissolved oxygen concentration in TMAH stored in the tank 16 depends on a supply flow rate of an oxygen-containing gas and a supply flow rate of an inert-gas-containing gas supplied to the tank 16. When a supply flow rate of an oxygen-containing gas and a supply flow rate of an inert-gas-containing gas supplied to the tank 16 are higher, a period until a dissolved oxygen concentration in TMAH reaches a target dissolved oxygen concentration becomes shorter.

As described above, according to this embodiment, when an oxygen-containing gas and an inert-gas-containing gas are supplied to TMAH, the oxygen-containing gas and the inert-gas-containing gas are dissolved in TMAH. When supply of an oxygen-containing gas and an inert-gas-containing gas at a predetermined mixing ratio to TMAH continues, a dissolved oxygen concentration in TMAH converges at a certain concentration. Thus, when a mixing ratio between an oxygen-containing gas and an inert-gas-containing gas supplied to TMAH is set as a mixing ratio corresponding to a predetermined target dissolved oxygen concentration in TMAH, it is possible to prepare TMAH maintained at a target dissolved oxygen concentration (maintained at a dissolved oxygen concentration such that a desired etching rate is obtained).

In addition, in the first embodiment, TMAH recovered from the processing unit 2 is stored in the tank 16, and an oxygen-containing gas and an inert-gas-containing gas may be supplied to the recovered TMAH by the gas dissolving unit 26.

The TMAH recovered from the processing unit 202 has an extremely high dissolved oxygen concentration. It is necessary to prepare TMAH in which a desired dissolved oxygen concentration (low concentration) is maintained on the basis of the dissolved oxygen concentration in TMAH. The method (feedback control) described in US 2013306238 A1 is unsuitable when a dissolved oxygen concentration in target TMAH is extremely high.

Even if a dissolved oxygen concentration in TMAH is extremely high, when supply of an oxygen-containing gas and an inert-gas-containing gas at a predetermined mixing ratio (supply flow rate ratio) to TMAH continues, the dissolved oxygen concentration in TMAH can be adjusted to a target dissolved oxygen concentration corresponding to a desired etching rate. Accordingly, it is possible to prepare TMAH in which a desired dissolved oxygen concentration (low concentration) is maintained on the basis of TMAH (TMAH in which a dissolved oxygen concentration is extremely high) recovered from the processing unit.

Accordingly, in the substrate processing device 1, it is possible to process a substrate using a chemical liquid maintained at a target dissolved oxygen concentration (maintained at a dissolved oxygen concentration such that a desired etching rate is obtained). Accordingly, it is possible to process the substrate W at a desired etching rate.

Second Embodiment

Figure 5:
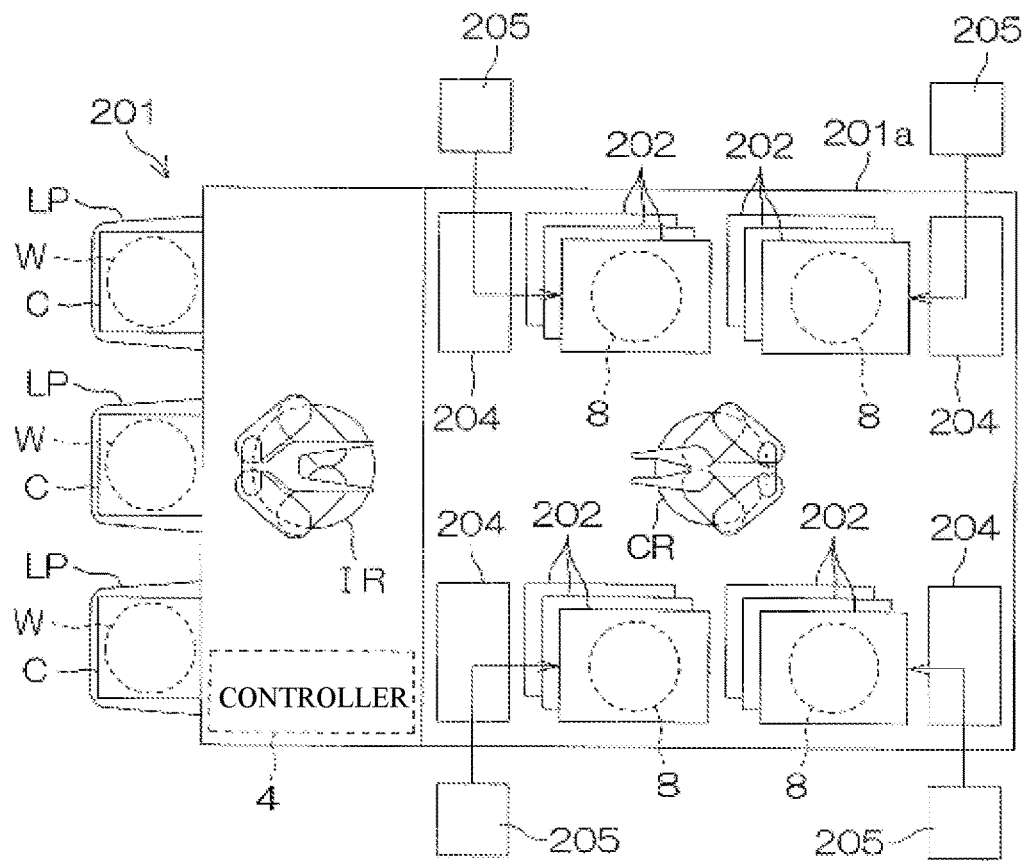
FIG. 5 is a schematic diagram of a substrate processing device according to a second embodiment of the present disclosure when viewed from above.

FIG. 5 is a schematic diagram of a substrate processing device 201 according to a second embodiment of the present disclosure when viewed from above.

In the second embodiment, parts the same as in the above first embodiment (the embodiment shown in FIG. 1 to FIG. 4) will be denoted with the same reference numerals as in FIG. 1 to FIG. 4 and descriptions thereof will be omitted.

The substrate processing device 201 is a single-wafer device configured to process disk-like substrates W such as semiconductor wafers one by one. The substrate processing device 201 includes a plurality of load ports LP that hold a substrate container C such as a front-opening unified pod (FOUP) and a plurality of processing units 202 configured to process the substrate W transported from the plurality of load ports LP with a processing fluid such as a processing liquid or a processing gas.

The substrate processing device 201 further includes a transport robot configured to transport the substrate W between the load port LP and the processing unit 202. The transport robot includes an indexer robot IR and a substrate transport robot CR. The indexer robot IR transports the substrate W between the load port LP and the substrate transport robot CR. The substrate transport robot CR transports the substrate W between the indexer robot IR and the processing unit 202. The indexer robot IR includes a hand that supports the substrate W. Similarly, the substrate transport robot CR includes a hand that supports the substrate W. The processing units 202 have the same configuration as the processing unit 2 (refer to FIG. 1) according to the first embodiment.

The substrate processing device 201 includes a plurality of (for example, four) fluid boxes 204 in which a fluid device such as a discharge valve 275 to be described below is accommodated. The processing unit 202 and the fluid box 204 are disposed in an outer wall 201a of the substrate processing device 201 and are covered with the outer wall 201a of the substrate processing device 201. A box-type chemical liquid preparation unit (chemical liquid preparation device) 205 in which tanks 211, 212, 213, and 214 to be described below and the like are accommodated are disposed outside the outer wall 201a of the substrate processing device 201. The chemical liquid preparation unit 205 may be disposed on the side of the substrate processing device 201 or may be disposed below (underground) a clean room in which the substrate processing device 201 is deployed.

The plurality of processing units 202 form a plurality of (for example, four) towers that are disposed to surround the substrate transport robot CR in a plan view. The towers include the plurality of (for example, three) processing units 202 stacked vertically. The four fluid boxes 204 correspond to four towers. The four chemical liquid preparation units 205 correspond to four towers.

A chemical liquid stored in each of the chemical liquid preparation units 205 is supplied to the three processing units 202 corresponding to the chemical liquid preparation unit 205 through the fluid box 204 corresponding to the chemical liquid preparation unit 205. In addition, a chemical liquid (for example, TMAH) used in the three processing units 202 constituting the same tower is recovered in the chemical liquid preparation unit 205 corresponding to the tower through the fluid box 204 corresponding to the tower.

Figure 6:
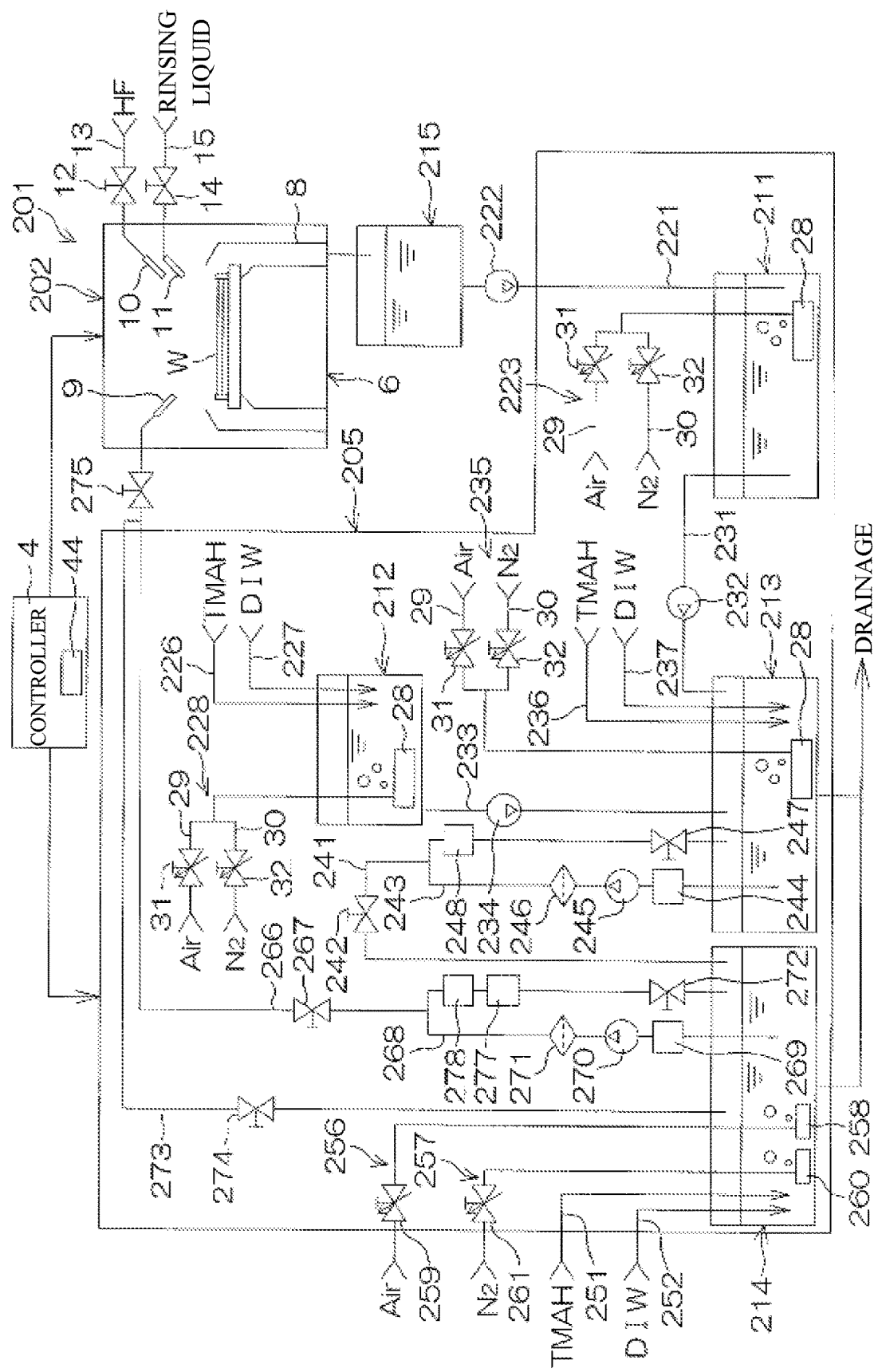
FIG. 6 is a diagram of a chemical liquid preparation unit shown in FIG. 5 when viewed in a horizontal direction.

FIG. 6 is a diagram of the chemical liquid preparation unit 205 when viewed in a horizontal direction.

The chemical liquid preparation unit 205 includes the recovery tank (first tank) 211 in which TMAH recovered from the corresponding three processing units 202 is stored, the fresh liquid tank (first tank) 212 in which fresh TMAH liquid is stored, the supply tank (third tank) 214 in which TMAH to be supplied to the corresponding three processing units 202 is stored, and the buffer tank (second tank) 213 for buffering chemical liquid supply of the supply tank 214. The buffer tank 213 is connected to the upstream side from the supply tank 214, and the recovery tank 211 and the fresh liquid tank 212 are connected to the upstream side from the buffer tank 213.

The chemical liquid preparation unit 205 further includes a first liquid feeding piping 221 for feeding TMAH to the recovery tank 211 from a collective recovery tank 215 for storing TMAH recovered from the processing cup 8 of the processing units 202 and a recovery gas dissolving unit (first gas supply dissolving unit) 223 configured to supply an oxygen-containing gas and an inert-gas-containing gas to TMAH in the recovery tank 211 and dissolve the oxygen-containing gas and the inert-gas-containing gas in the TMAH. TMAH in the collective recovery tank 215 is moved to the first liquid feeding piping 221 by a first liquid feeding pump 222.

A dissolved oxygen concentration in TMAH recovered from the processing unit 202 is extremely high (substantially matches a saturation concentration. Thus, a dissolved oxygen concentration in TMAH that is supplied to and stored in the recovery tank 211 is also extremely high.

The inert-gas-containing gas may be nitrogen gas or a mixed gas of nitrogen gas and a gas other than nitrogen gas. Similarly, the oxygen-containing gas may be oxygen gas or a mixed gas of oxygen gas and a gas other than oxygen gas. Hereinafter, an example in which an inert-gas-containing gas is nitrogen gas which is an example of an inert gas and an oxygen-containing gas is dry air (dried clean air) containing nitrogen and oxygen at a ratio of about 8:2 will be described.

The recovery gas dissolving unit 223 includes the mixed gas piping 28 through which a mixed gas of an oxygen-containing gas and an inert-gas-containing gas is discharged into the recovery tank 211, the oxygen-containing gas piping 29, the inert-gas-containing gas piping 30, the first flow rate adjusting valve 31, and the second flow rate adjusting valve 32. Since the recovery gas dissolving unit 223 has the same configuration as the gas dissolving unit 26 according to the first embodiment, it is denoted with the same reference numeral and description thereof will be omitted.

The chemical liquid preparation unit 205 further includes a first TMAH replenishing piping 226 through which a fresh TMAH stock solution is supplied to the fresh liquid tank 212, a first pure water replenishing piping 227 through which fresh pure water is supplied to the fresh liquid tank 212, and a gas dissolving unit for a fresh liquid (first gas supply dissolving unit) 228 configured to supply an oxygen-containing gas and an inert-gas-containing gas to TMAH in the fresh liquid tank 212 and dissolve the oxygen-containing gas and the inert-gas-containing gas at a predetermined ratio in the TMAH.

Pure water is supplied to the first pure water replenishing piping 227 from a pure water supply source provided in a factory in which the substrate processing device 1 is provided. Therefore, pure water supplied to the fresh liquid tank 212 through the first pure water replenishing piping 227 is water with an extremely low dissolved oxygen concentration. Therefore, a dissolved oxygen concentration in TMAH obtained by mixing a fresh TMAH stock solution from the first TMAH replenishing piping 226 and fresh pure water from the first pure water replenishing piping 227 is low. Therefore, a dissolved oxygen concentration in TMAH stored in the fresh liquid tank 212 is low.

The gas dissolving unit for a fresh liquid 228 includes the mixed gas piping 28 through which a mixed gas of an oxygen-containing gas and an inert-gas-containing gas is discharged into the recovery tank 211, the oxygen-containing gas piping 29, the inert-gas-containing gas piping 30, the first flow rate adjusting valve 31, and the second flow rate adjusting valve 32. Since the gas dissolving unit for a fresh liquid 228 has the same configuration as the gas dissolving unit 26 according to the first embodiment, it is denoted with the same reference numeral and description thereof will be omitted.

The chemical liquid preparation unit 205 further includes a second liquid feeding piping 231 for feeding TMAH to the buffer tank 213 from the recovery tank 211, a second liquid feeding pump 232 configured to move TMAH in the recovery tank 211 to the second liquid feeding piping 231, a third liquid feeding piping 233 for feeding TMAH into the buffer tank 213 from the fresh liquid tank 212, a third liquid feeding pump 234 configured to move TMAH in the fresh liquid tank 212 to the third liquid feeding piping 233, a buffer gas dissolving unit (second gas supply dissolving unit) 235 configured to supply an oxygen-containing gas and an inert-gas-containing gas to TMAH in the buffer tank 213 and dissolve the oxygen-containing gas and the inert-gas-containing gas in the TMAH, a second TMAH replenishing piping 236 for supplying a fresh TMAH stock solution to the buffer tank 213, and a second pure water replenishing piping 237 for supplying fresh pure water to the buffer tank 213.

The buffer gas dissolving unit 235 includes the mixed gas piping 28 through which a mixed gas of an oxygen-containing gas and an inert-gas-containing gas is discharged into the recovery tank 211, the oxygen-containing gas piping 29, the inert-gas-containing gas piping 30, the first flow rate adjusting valve 31, and the second flow rate adjusting valve 32. Since the buffer gas dissolving unit 235 has the same configuration as the gas dissolving unit 26 according to the first embodiment, it is denoted with the same reference numeral and description thereof will be omitted.

Pure water is supplied to the second pure water replenishing piping 237 from a pure water supply source provided in a factory in which the substrate processing device 1 is provided. Therefore, pure water supplied to the buffer tank 213 through the second pure water replenishing piping 237 is water with an extremely low dissolved oxygen concentration (about 0.5 ppm).

The chemical liquid preparation unit 205 includes a third liquid feeding piping 241 for feeding TMAH in the buffer tank 213 to the supply tank 214, a first liquid feeding valve 242 that opens and closes the third liquid feeding piping 241, a first circulation piping 243 that connects the third liquid feeding piping 241 and the buffer tank 213, a first temperature adjusting unit 244 (a heating unit or a cooling unit) configured to adjust a temperature of TMAH that circulates in the first circulation piping 243 to a desired liquid temperature, a fourth liquid feeding pump 245 configured to feed TMAH in the buffer tank 213 to the first circulation piping 243, a first filter 246 configured to remove foreign substances in TMAH that circulates in the first circulation piping 243, a first circulation valve 247 that opens and closes the first circulation piping 243, and a first dissolved gas sensor 248 configured to measure a dissolved oxygen concentration in TMAH that circulates in the first circulation piping 243.

When TMAH in the buffer tank 213 is supplied to the supply tank 214, the first liquid feeding valve 242 is opened and the first circulation valve 247 is closed. In this state, TMAH fed from the buffer tank 213 to the third liquid feeding piping 241 by the fourth liquid feeding pump 245 is supplied to the supply tank 214.

On the other hand, when TMAH is not supplied to the supply tank 214, the first circulation valve 247 is opened and the first liquid feeding valve 242 is closed. In this state, TMAH fed from the buffer tank 213 to the first circulation piping 243 by the fourth liquid feeding pump 245 returns into the buffer tank 213. Therefore, when TMAH is not supplied to the supply tank 214, TMAH continues to circulate through a circulation path formed by the buffer tank 213 and the first circulation piping 243.

The chemical liquid preparation unit 205 includes a third TMAH replenishing piping 251 for supplying a fresh TMAH stock solution to the supply tank 214 and a third pure water replenishing piping 252 for supplying fresh pure water to the supply tank 214.

Pure water is supplied to the third pure water replenishing piping 252 from a pure water supply source provided in a factory in which the substrate processing device 1 is provided. Therefore, pure water supplied to the supply tank 214 through the third pure water replenishing piping 252 is water with an extremely low dissolved oxygen concentration (about 0.5 ppm). However, the third TMAH replenishing piping 251 and the third pure water replenishing piping 252 are used to adjust a concentration of TMAH (a concentration of a TMAH component) stored in the supply tank 214, and only a small amount compared to a capacity of the supply tank 214 is supplied. Therefore, a dissolved oxygen concentration in TMAH stored in the supply tank 214 according to supply of pure water from the third pure water replenishing piping 252 to the supply tank 214 is hardly decreased.

The chemical liquid preparation unit 205 includes an oxygen gas dissolving unit 256 configured to supply an oxygen-containing gas to TMAH in the supply tank 214 and dissolve the oxygen-containing gas in the TMAH and an inert gas dissolving unit 257 configured to supply an inert-gas-containing gas to TMAH in the supply tank 214 and dissolve the inert-gas-containing gas in the TMAH.

The oxygen gas dissolving unit 256 includes an oxygen-containing gas piping 258 and a third flow rate adjusting valve 259 configured to change a flow rate of an oxygen-containing gas supplied to the oxygen-containing gas piping 258 from an oxygen-containing gas supply source. The oxygen-containing gas piping 258 includes a bubbling piping through which an oxygen-containing gas is discharged from a discharge port disposed in TMAH (in a liquid) and thus oxygen-containing gas bubbles are generated in TMAH.

The inert gas dissolving unit 257 includes an inert-gas-containing gas piping 260 and a fourth flow rate adjusting valve 261 that changes a flow rate of an inert-gas-containing gas supplied from an inert-gas-containing gas supply source to the inert-gas-containing gas piping 260. The inert-gas-containing gas piping 260 includes a bubbling piping through which an inert-gas-containing gas is discharged from a discharge port disposed in TMAH (in a liquid) and thus inert-gas-containing gas bubbles are generated in TMAH.

The chemical liquid preparation unit 205 includes a supply piping 266 for feeding TMAH in supply tank 214 to the corresponding processing unit 202 (the first chemical liquid nozzle 9), a supply valve 267 that opens and closes the supply piping 266, a second circulation piping 268 that connects the supply piping 266 and the supply tank 214, a second temperature adjusting unit 269 (a heating unit or a cooling unit) configured to adjust a temperature of TMAH that circulates in the second circulation piping 268 to a desired liquid temperature, a fifth liquid feeding pump 270 configured to feed TMAH in the supply tank 214 into the second circulation piping 268, a second filter 271 configured to remove foreign substances in TMAH that circulates in the second circulation piping 268, a second circulation valve 272 that opens and closes the second circulation piping 268, a second dissolved gas sensor 277 configured to measure a dissolved oxygen concentration in TMAH that circulates in the second circulation piping 268, and a concentration sensor 278 configured to measure a concentration of TMAH (a concentration of a TMAH component) that circulates in the second circulation piping 268.

Control of a concentration of TMAH (concentration of a TMAH component) stored in the supply tank 214 is performed by feedback control based on the actually measured concentration of TMAH (concentration of a TMAH component). Specifically, a concentration of TMAH (concentration of a TMAH component) stored in the supply tank 214 is measured by the concentration sensor 278. When the measured concentration is higher than a target dissolved oxygen concentration corresponding to a desired etching rate, the controller 4 supplies pure water from the third pure water replenishing piping 252 to the supply tank 214. In this case, supply of pure water refers to dropping of several drops of pure water. In addition, when the measured concentration is lower than a target dissolved oxygen concentration corresponding to a desired etching rate, the controller 4 supplies TMAH from the third TMAH replenishing piping 251 to the supply tank 214. In this case, supply of TMAH refers to dropping of several drops of TMAH.

A discharge piping 276 is connected to a downstream end of the supply piping 266 through the discharge valve 275. The first chemical liquid nozzle 9 is connected to a downstream end of the discharge piping 276. Slightly upstream from a downstream end of the supply piping 266, one end of a return piping 273 is connected by branch. The other end of the return piping 273 is connected to the supply tank 214. A return valve 274 for opening and closing the return piping 273 is inserted at an intermediate part of the return piping 273.

When TMAH in the supply tank 214 is supplied to the processing unit 202, the supply valve 267 is opened and the second circulation valve 272 is closed. In this state, TMAH fed from the supply tank 214 to the supply piping 266 by the fifth liquid feeding pump 270 is supplied to the processing unit 202.

On the other hand, when supply of TMAH to the processing unit 202 is stopped, the second circulation valve 272 is opened and the supply valve 267 is closed. In this state, TMAH fed from the supply tank 214 to the second circulation piping 268 by the fifth liquid feeding pump 270 returns into the supply tank 214. Therefore, during supply stoppage in which supply of TMAH to the processing unit 202 is stopped, TMAH continues to circulate through a circulation path formed by the supply tank 214 and the second circulation piping 268.

While TMAH in the supply tank 214 is supplied to the processing unit 202, when TMAH is discharged from the first chemical liquid nozzle 9, the return valve 274 is closed and the discharge valve 275 is opened. In this state, TMAH is supplied from the supply piping 266 to the first chemical liquid nozzle 9 through the discharge piping 276, and the TMAH is discharged toward the upper surface of the substrate W from the first chemical liquid nozzle 9.

Figure 7:
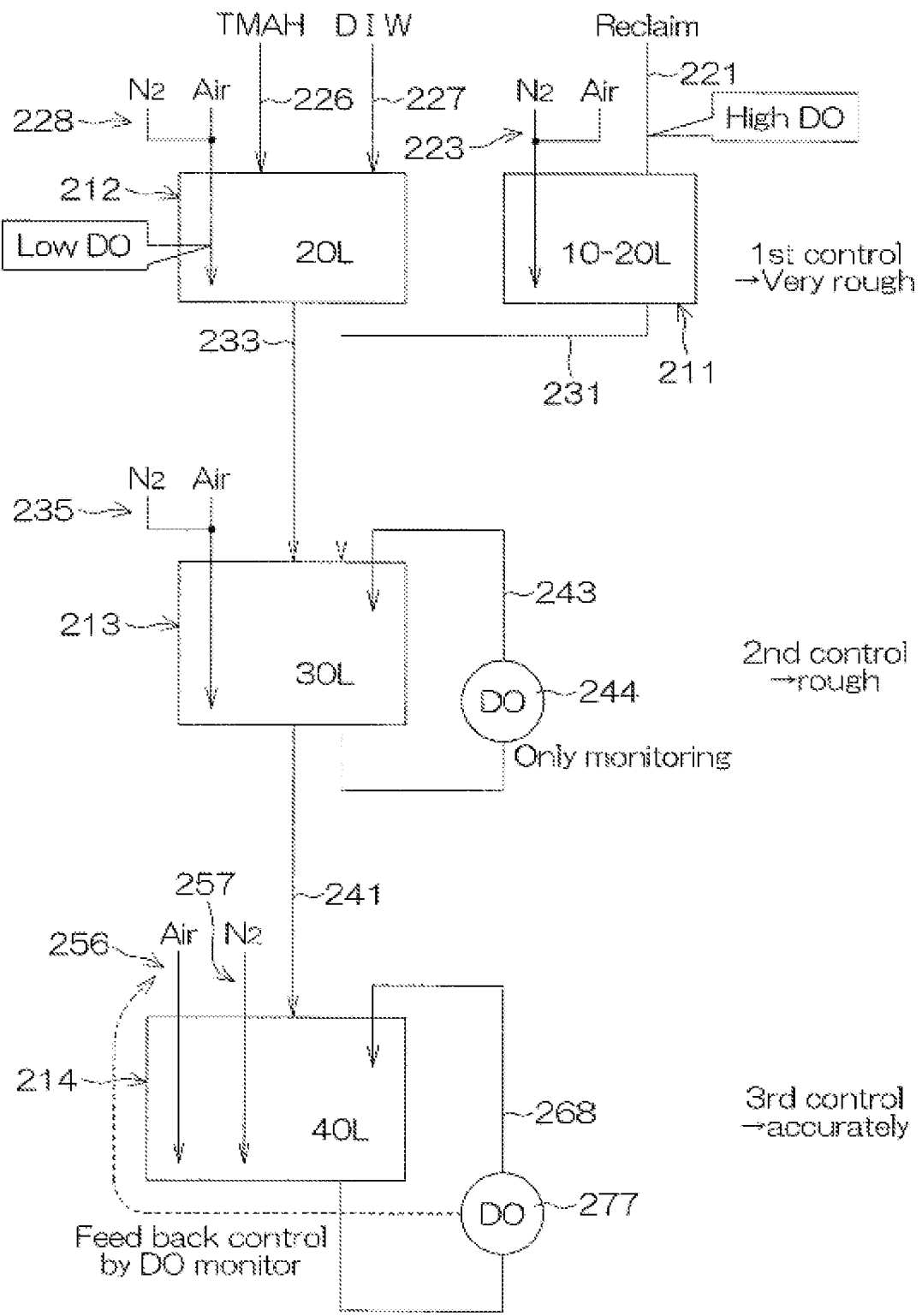
FIG. 7 is a diagram schematically showing correlations between four tanks included in the chemical liquid preparation unit.

FIG. 7 is a diagram schematically showing correlations between the four tanks 211, 212, 213, and 214 included in the chemical liquid preparation unit 205. Adjustment of a dissolved oxygen concentration in TMAH (gas dissolving process) stored in the four tanks 211, 212, 213, and 214 will be described with reference to FIG. 6 and FIG. 7.

As shown in FIG. 7, in the chemical liquid preparation unit 205, adjustment of a dissolved oxygen concentration in TMAH by dissolving a gas in TMAH is performed in three stages. In the stages, the tanks 211, 212, 213, and 214 used are different from each other.

First, first stage adjustment of a dissolved oxygen concentration in TMAH will be described. First, the first stage adjustment brings a dissolved oxygen concentration in TMAH roughly close to a target dissolved oxygen concentration (a target dissolved oxygen concentration corresponding to a desired etching rate). The first stage adjustment is very rough adjustment, and is performed by, for example, adjusting a period corresponding to a first period Ra shown in FIG. 3C. Here, as described above, an etching rate of TMAH depends on a dissolved oxygen concentration (dissolved oxygen amount) in TMAH.

The first stage adjustment is performed in the recovery tank 211. In the recovery tank 211, TMAH (High DO) with an extremely high dissolved oxygen concentration recovered from the processing unit 2 is stored. A gas dissolving process (first gas dissolving process, dissolving of an oxygen-containing gas and an inert-gas-containing gas in TMAH) is performed on TMAH stored in the recovery tank 211.

Specifically, the controller 4 controls the recovery gas dissolving unit 223 such that a mixed gas containing an oxygen-containing gas and an inert-gas-containing gas is supplied to the mixed gas piping 28. Accordingly, the mixed gas piping 28 discharges a mixed gas of an oxygen-containing gas and an inert-gas-containing gas from a discharge port disposed in TMAH (in a liquid), and thus mixed gas bubbles are generated in TMAH. Accordingly, an oxygen-containing gas and an inert-gas-containing gas are dissolved in TMAH.

In addition, the controller 4 controls mixing ratio adjusting units (the first flow rate adjusting valve 31 and the second flow rate adjusting valve 32) included in the recovery gas dissolving unit 223, adjusts a mixing ratio (supply flow rate ratio) of an oxygen-containing gas and an inert-gas-containing gas contained in a mixed gas supplied to TMAH, and thus adjusts a dissolution ratio between an oxygen-containing gas and an inert-gas-containing gas in TMAH. Specifically, the controller 4 acquires a dissolved oxygen concentration in TMAH (a concentration of TMAH corresponding to a desired etching rate) supplied to the substrate W from the storage unit 42. In addition, the controller 4 refers to the correspondence relationship 44 between a mixing ratio between an oxygen-containing gas and an inert-gas-containing gas (supply flow rate ratio) and a convergent dissolved oxygen concentration in the storage unit 42 and acquires a mixing ratio between an oxygen-containing gas and an inert-gas-containing gas (supply flow rate ratio) when a dissolved oxygen concentration in TMAH (target dissolved oxygen concentration) supplied to the substrate W (a concentration of TMAH corresponding to a desired etching rate) is set as a convergent dissolved oxygen concentration. Then, the controller 4 adjusts degrees of opening of the first and second flow rate adjusting valves 31 and 32 so that the acquired mixing ratio (supply flow rate ratio) is reached.

When a gas dissolving process is performed on TMAH stored in the recovery tank 211, a dissolved oxygen concentration in TMAH stored in the recovery tank 211 is lowered from an initial high value. TMAH with a dissolved oxygen concentration that is roughly lowered in the recovery tank 211 is sent to the buffer tank 213.

In addition, the first stage adjustment of a dissolved oxygen concentration in TMAH is also performed in the fresh liquid tank 212. As described above, TMAH (Low DO) with an extremely low dissolved oxygen concentration is stored in the fresh liquid tank 212. A gas dissolving process (first gas dissolving process, dissolving of an oxygen-containing gas and an inert-gas-containing gas in TMAH) is performed on TMAH stored in the fresh liquid tank 212. In this embodiment, in the gas dissolving process (first gas dissolving process) performed on TMAH stored in the fresh liquid tank 212, a mixing ratio between an oxygen-containing gas and an inert-gas-containing gas (supply flow rate ratio) is the same as in the gas dissolving process (first gas dissolving process) performed on TMAH stored in the recovery tank 211. Since a specific method of the gas dissolving process in the fresh liquid tank 212 is the same as a specific method of the gas dissolving process in the recovery tank 211, description thereof will be omitted.

When a gas dissolving process is performed on TMAH stored in the fresh liquid tank 212, a dissolved oxygen concentration in TMAH stored in the fresh liquid tank 212 is lowered from an initial low value. TMAH with a dissolved oxygen concentration that is roughly lowered in the fresh liquid tank 212 is fed to the buffer tank 213.

Next, the second stage adjustment of a dissolved oxygen concentration in TMAH will be described. First, the second stage adjustment brings a dissolved oxygen concentration in TMAH to close to a certain target dissolved oxygen concentration (target dissolved oxygen concentration corresponding to a desired etching rate). The second stage adjustment is rough adjustment, and is performed by, for example, adjusting a period corresponding to a second period Rb shown in FIG. 3C. Here, as described above, an etching rate of TMAH depends on a dissolved oxygen concentration (dissolved oxygen amount) in TMAH.

The second stage adjustment of a dissolved oxygen concentration in TMAH is performed in the buffer tank 213. In the buffer tank 213, TMAH in which a dissolved oxygen concentration is very roughly adjusted fed from the recovery tank 211 and TMAH in which a dissolved oxygen concentration is very roughly adjusted fed from the fresh liquid tank 212 are stored. A gas dissolving process (second gas dissolving process, dissolving of an oxygen-containing gas and an inert-gas-containing gas in TMAH) is performed on TMAH stored in the buffer tank 213. In this embodiment, a mixing ratio between an oxygen-containing gas and an inert-gas-containing gas (supply flow rate ratio) in the gas dissolving process (second gas dissolving process) performed on TMAH stored in the buffer tank 213 is the same as a mixing ratio between an oxygen-containing gas and an inert-gas-containing gas (supply flow rate ratio) in the gas dissolving process (first gas dissolving process) performed on TMAH stored in the recovery tank 211 or the gas dissolving process (first gas dissolving process) performed on TMAH stored in the fresh liquid tank 212. Since a specific method of the gas dissolving process in the buffer tank 213 is the same as a specific method of the gas dissolving process in the recovery tank 211, description thereof will be omitted.

In TMAH on which the gas dissolving process is performed in the buffer tank 213, a dissolved oxygen concentration is sufficiently close to a target dissolved oxygen concentration (target dissolved oxygen concentration corresponding to a desired etching rate).

In this embodiment, a dissolved oxygen concentration in TMAH that circulates in the first circulation piping 243, that is, a dissolved oxygen concentration in TMAH stored in the buffer tank 213, is measured by the first dissolved gas sensor 248. However, in this embodiment, when a dissolved oxygen concentration in TMAH is simply observed (monitored), concentration control based on the measurement result is not performed. Thus, it is possible to remove the first dissolved gas sensor 248.

Next, the third stage adjustment of a dissolved oxygen concentration in TMAH will be described. First, the third stage adjustment brings a dissolved oxygen concentration in TMAH accurately close to a target dissolved oxygen concentration (target dissolved oxygen concentration corresponding to a desired etching rate). The third stage adjustment is accurate adjustment, and is performed by, for example, adjusting a period corresponding to a third period Rc shown in FIG. 3C. Here, as described above, an etching rate of TMAH depends on a dissolved oxygen concentration (dissolved oxygen amount) in TMAH.

The third stage adjustment of a dissolved oxygen concentration in TMAH is performed in the supply tank 214. In the supply tank 214, TMAH in which a dissolved oxygen concentration is roughly adjusted fed from the buffer tank 213 and TMAH fed from the fresh liquid tank 212 are stored.

The third stage adjustment of a dissolved oxygen concentration in TMAH is not performed in the gas dissolving process, but it is performed by feedback control based on the actually measured dissolved oxygen concentration in TMAH. Specifically, a dissolved oxygen concentration in TMAH stored in the supply tank 214 is measured by the second dissolved gas sensor 277 (measurement process). When the measured dissolved oxygen concentration is higher than a target dissolved oxygen concentration (target dissolved oxygen concentration corresponding to a desired etching rate), the controller 4 controls the inert gas dissolving unit 257 such that an inert-gas-containing gas is discharged from a discharge port of the inert-gas-containing gas piping 260, and inert-gas-containing gas bubbles are generated in TMAH (inert gas dissolve process). In addition, when the measured dissolved oxygen concentration is lower than a target dissolved oxygen concentration (target dissolved oxygen concentration corresponding to a desired etching rate), the controller 4 controls the oxygen gas dissolving unit 256 such that an oxygen-containing gas is discharged from a discharge port of the oxygen-containing gas piping 258, and oxygen-containing gas bubbles are generated in TMAH (oxygen-containing gas dissolve process).

The TMAH recovered from the processing unit 2 has an extremely high dissolved oxygen concentration. The method (feedback control) described in US 2013306238 A1 in which it is necessary to prepare TMAH in which a dissolved oxygen concentration desired (low concentration) is maintained on the basis of the dissolved oxygen concentration in TMAH is unsuitable when a dissolved oxygen concentration in target TMAH is extremely high.

However, in this embodiment, feedback control is performed on TMAH on which the gas dissolving process is performed in the buffer tank 213 and in which a dissolved oxygen concentration is sufficiently close to a target dissolved oxygen concentration. When a dissolved oxygen concentration in TMAH is sufficiently close to a target dissolved oxygen concentration, a dissolved oxygen concentration in TMAH can be adjusted to a target dissolved oxygen concentration with high accuracy according to feedback control. Accordingly, a dissolved oxygen concentration in TMAH stored in the supply tank 214 can be adjusted to a certain concentration with high accuracy.

As described above, according to the second embodiment, in the chemical liquid preparation unit 205, since the gas dissolving process (dissolving of an oxygen-containing gas and an inert-gas-containing gas in TMAH) is performed in two stages (the first gas dissolving process and the second gas dissolving process), even if TMAH to be subjected to the gas dissolving process is TMAH with a concentration (for example, an extremely high concentration or an extremely low concentration) that is far away from a target dissolved oxygen concentration, a dissolved oxygen concentration in TMAH can be adjusted to the target dissolved oxygen concentration. Accordingly, it is possible to prepare TMAH in which a desired dissolved oxygen concentration is maintained more suitably.

In addition, a mixing ratio between an oxygen-containing gas and an inert-gas-containing gas (supply flow rate ratio) in the gas dissolving process (second gas dissolving process) performed on TMAH stored in the buffer tank 213 is the same as a mixing ratio between an oxygen-containing gas and an inert-gas-containing gas (supply flow rate ratio) in the gas dissolving process (first gas dissolving process) performed on TMAH stored in the recovery tank 211 or the gas dissolving process (first gas dissolving process) performed on TMAH stored in the fresh liquid tank 212. Accordingly, a dissolved oxygen concentration in the chemical liquid can be adjusted to a final target dissolved oxygen concentration with higher accuracy.

Accordingly, in the substrate processing device 201, it is possible to process a substrate using a chemical liquid maintained at a target dissolved oxygen concentration (maintained at a dissolved oxygen concentration such that a desired etching rate is obtained). Accordingly, it is possible to process the substrate W at a desired etching rate.

In the second embodiment, a mixing ratio between an oxygen-containing gas and an inert-gas-containing gas (a ratio of a supply flow rate of an oxygen-containing gas to a supply flow rate of an inert-gas-containing gas) in the gas dissolving process (first gas dissolving process) performed on TMAH stored in the recovery tank 211 or the gas dissolving process (first gas dissolving process) performed on TMAH stored in the fresh liquid tank 212 may be lower than a mixing ratio between an oxygen-containing gas and an inert-gas-containing gas (a ratio of a supply flow rate of an oxygen-containing gas to a supply flow rate of an inert-gas-containing gas) in the gas dissolving process (second gas dissolving process) performed on TMAH stored in the buffer tank 213. In this case, a target dissolved oxygen concentration in the gas dissolving process (first gas dissolving process) performed on TMAH stored in the recovery tank 211 or the gas dissolving process (first gas dissolving process) performed on TMAH stored in the fresh liquid tank 212 can be set to be lower than a target dissolved oxygen concentration in the gas dissolving process (second gas dissolving process) performed on TMAH stored in the buffer tank 213. Accordingly, a dissolved oxygen concentration in the chemical liquid can be brought close to a final target dissolved oxygen concentration within a shorter period.

In addition, in the second embodiment, the third stage adjustment of a dissolved oxygen concentration in TMAH is not performed by feedback control based on the actually measured dissolved oxygen concentration in TMAH, but it may be performed in the gas dissolving process. That is, adjustment of a dissolved oxygen concentration in TMAH in all of the tanks 211, 212, 213, and 214 may be performed in the gas dissolving process.

In addition, while a configuration in which a dissolved oxygen concentration in TMAH is adjusted in three stages has been described, a dissolved oxygen concentration may be adjusted in two stages or four or more stages.

Third Embodiment

Figure 8:
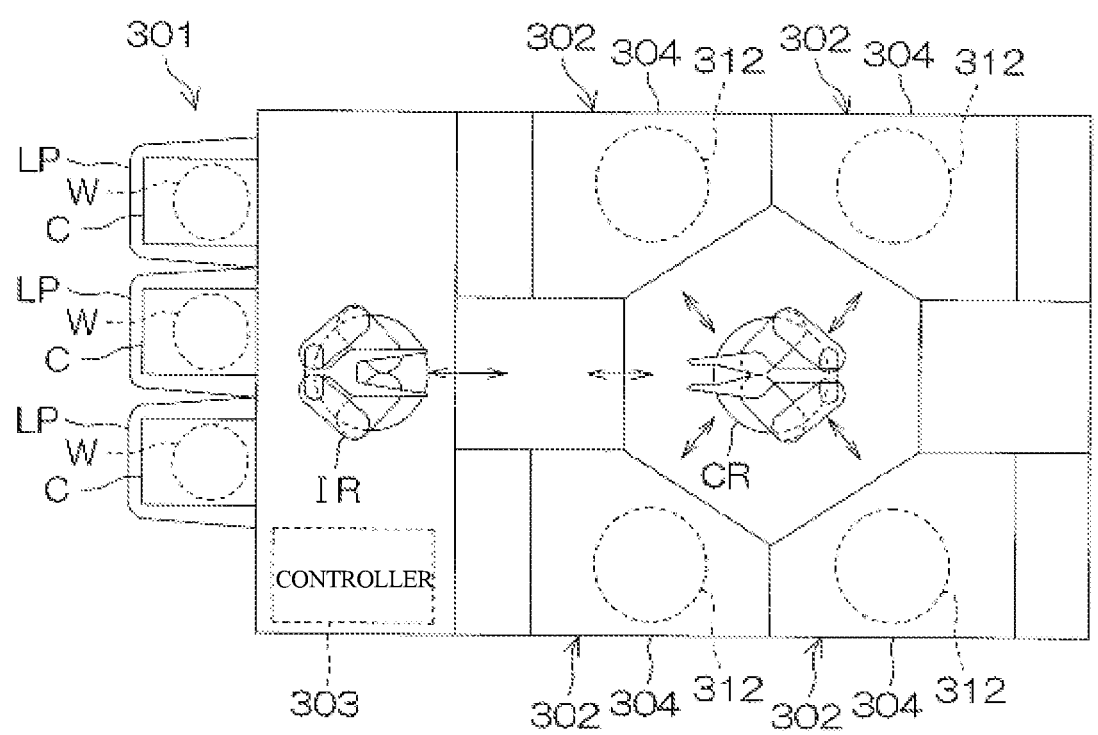
FIG. 8 is a schematic diagram of a substrate processing device according to a third embodiment of the present disclosure when viewed from above.

FIG. 8 is a schematic diagram of a substrate processing device 301 according to a third embodiment of the present disclosure when viewed from above.

The substrate processing device 301 is a single-wafer device configured to process substrates (for example, silicon substrates) W such as silicon wafers one by one. In this embodiment, the substrate W is a disk-like substrate. The substrate processing device 301 includes a plurality of processing units 302 configured to process the substrate W using a processing liquid, a load port LP on which a substrate container C in which a plurality of substrates W to be processed by the processing unit 302 are accommodated is placed, an indexer robot IR and a substrate transport robot CR that transport the substrate W between the load port LP and the processing unit 302, and a controller 303 configured to control the substrate processing device 301. The indexer robot IR transports the substrate W between the substrate container C and the substrate transport robot CR. The substrate transport robot CR transports the substrate W between the indexer robot IR and the processing unit 302. The plurality of processing units 302 have, for example, the same configuration.

Figure 9A:
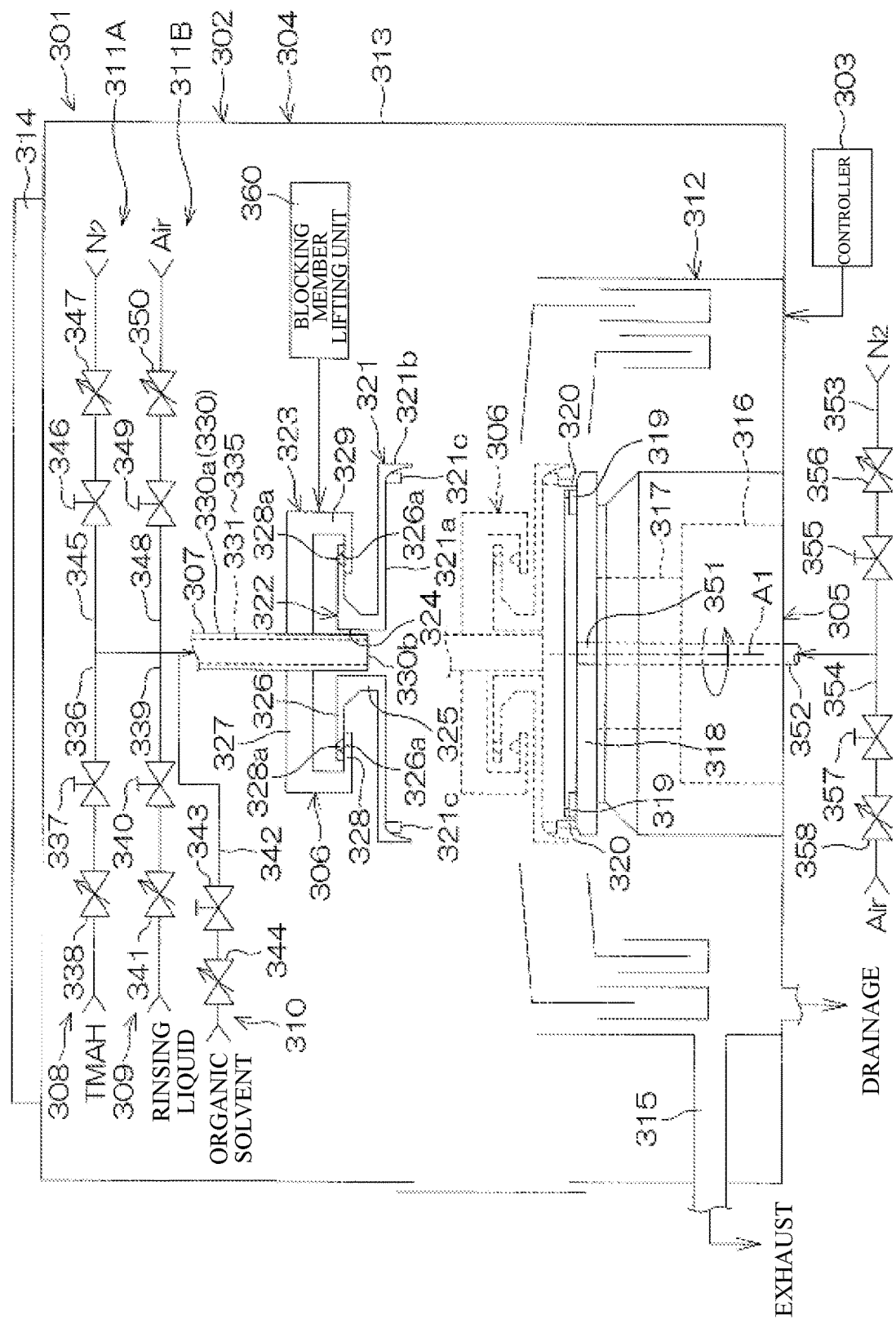
FIG. 9A is a schematic cross-sectional view for explaining a configuration example of a processing unit shown in FIG. 8.
Figure 9B:
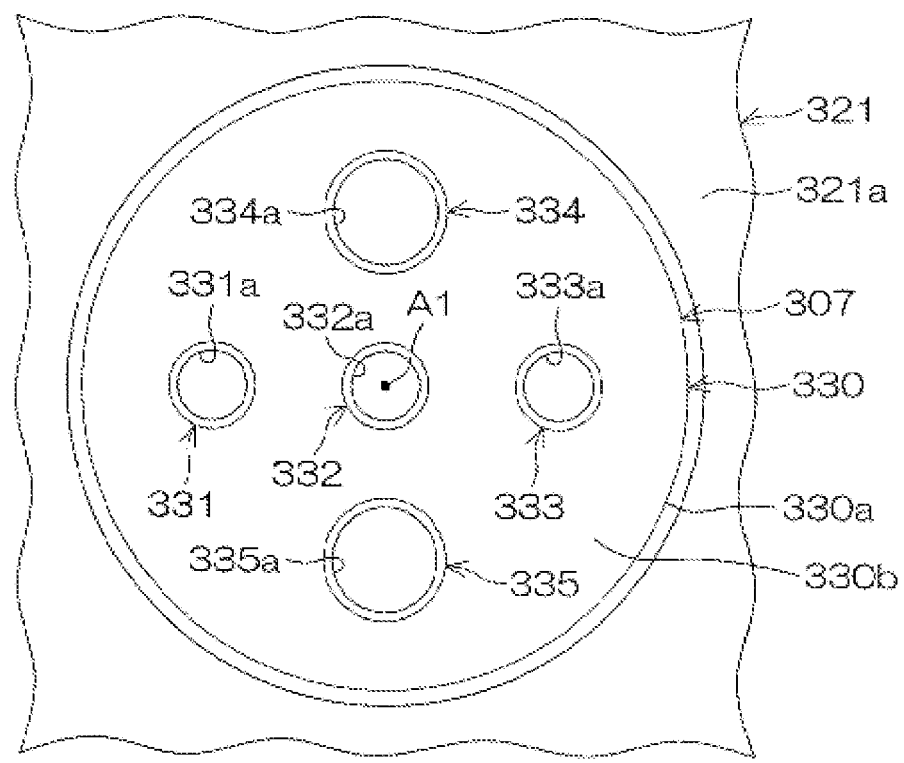
FIG. 9B is a bottom view of a center axis nozzle shown in FIG. 9A.

FIG. 9A is a schematic cross-sectional view for explaining a configuration example of the processing unit 302. FIG. 9B is a bottom view of a center axis nozzle 307.

The process performed by the processing unit 302 may include an etching process in which an etching liquid is supplied to a substrate W with an outermost layer on which a target film such as a polysilicon film (poly-Si film) is formed or may include a developing process in which a developing liquid is supplied to the substrate W after exposure.

The processing unit 302 includes a box-type chamber 304, a spin chuck 305 that holds one substrate W horizontally in the chamber 304 and rotates the substrate W around a vertical axis of rotation A1 that passes through the center of the substrate W, a blocking member 306 that faces an upper surface of the substrate W held by the spin chuck 305, the center axis nozzle 307 which is vertically inserted into the blocking member 306 and through which a processing liquid is discharged to the central part of the upper surface of the substrate W held by the spin chuck 305, a chemical liquid supply unit 308 configured to supply a chemical liquid to the center axis nozzle 307, a rinsing liquid supply unit 309 configured to supply a rinsing liquid to the center axis nozzle 307, an organic solvent supply unit 310 configured to supply an organic solvent as a low surface tension liquid that has a higher specific gravity than air and a lower surface tension than water to the center axis nozzle 307, an inert-gas-containing gas supply unit 311A configured to supply an inert-gas-containing gas to the center axis nozzle 307, the oxygen-containing gas supply unit 311B configured to supply an oxygen-containing gas to the center axis nozzle 307, and a cylindrical processing cup 312 that surrounds the spin chuck 305.

The chamber 304 includes a box-type partition wall 313 in which the spin chuck 305 is accommodated, a fan and filter unit (FFU) 314 as an air blowing unit configured to send clean air (air filtered by a filter) into the partition wall 313 from an upper part of the partition wall 313, and an exhaust duct 315 through which a gas in the chamber 304 is discharged from a lower part of the partition wall 313. The FFU 314 is disposed above the partition wall 313 and is attached to a ceiling of the partition wall 313. The FFU 314 sends clean air downward from the ceiling of the partition wall 313 into the chamber 304. The exhaust duct 315 is connected to a bottom of the processing cup 312 and leads a gas in the chamber 304 toward an exhaust treatment facility provided in a factory in which the substrate processing device 301 is deployed. Thus, a downflow (downward flow) that flows downward in the chamber 304 is formed by the FFU 314 and the exhaust duct 315. The substrate W is processed when a downflow is formed in the chamber 304.

As the spin chuck 305, a clamping-type chuck into which the substrate W is inserted in a horizontal direction and which hold the substrate W horizontally is used. Specifically, the spin chuck 305 includes a spin motor 316, a spin shaft 317 integrated with a drive shaft of the spin motor 316, and a disk-like spin base 318 that is substantially horizontally attached to an upper end of the spin shaft 317.

A plurality of (three or more, for example, six) clamping members 319 are disposed on a peripheral part of an upper surface of the spin base 318. The plurality of clamping members 319 are disposed at appropriate intervals on the circumference corresponding to the outer circumferential shape of the substrate W on a peripheral part of the upper surface of the spin base 318. On an upper surface of the spin base 318, a plurality of (three or more) blocking member supports 320 for supporting the blocking member 306 from below are disposed on the circumference around the axis of rotation A1. A distance between the blocking member support 320 and the axis of rotation A1 is set to be larger than a distance between the clamping member 319 and the axis of rotation A1.

The blocking member 306 is a follower type blocking member (that is, blocking member) that rotates according to the spin chuck 305. That is, the blocking member 306 is supported so that the blocking member 306 can rotate integrally with the spin chuck 305 while the substrate is processed.

The blocking member 306 includes a blocking plate 321, an engaging part 322 that is provided on the blocking plate 321 such that it can be moved up and down together with the blocking plate 321, and a support 323 that is engaged with the engaging part 322 and supports the blocking plate 321 from above.

The blocking plate 321 has a disk shape having a larger diameter than the substrate W. The blocking plate 321 includes a circular substrate-facing surface 321a that faces the entire upper surface area of the substrate W on the bottom surface, an annular flange part 321b that protrudes downward on a peripheral part of the substrate-facing surface 321a, and a spin chuck engaging part 321c that is provided on the substrate-facing surface 321a and is engaged with the blocking member support 320. A through-hole 324 that vertically penetrates the blocking member 306 is formed at a central part of the substrate-facing surface 321a. The through-hole 324 is defined by a cylindrical inner circumferential surface.

On an upper surface of the blocking plate 321, the engaging part 322 includes a cylindrical part 325 that surrounds the periphery of the through-hole 324 and a flange part 326 that extends outward from an upper end of the cylindrical part 325 in the radial direction. The flange part 326 is positioned above a flange support 328 to be described below included in the support 323, and the outer circumference of the flange part 326 has a larger diameter than the inner circumference of the flange support 328.

The support 323 includes, for example, a substantially disk-like support main body 327, the horizontal flange support 328, and a connecting part 329 that connects the support main body 327 and the flange support 328.

The center axis nozzle 307 extends in a vertical axis that passes through the center of the blocking plate 321 and the substrate W, that is, extends in a vertical direction along the axis of rotation A1. The center axis nozzle 307 is disposed above the spin chuck 305 and is inserted into an internal space of the blocking plate 321 and the support 323. The center axis nozzle 307 is moved up and down together with the blocking plate 321 and the support 323.

The center axis nozzle 307 includes a cylindrical casing 330 that vertically extends the inside of the through-hole 324, and a first nozzle piping 331, a second nozzle piping 332, a third nozzle piping 333, a fourth nozzle piping 334 and a fifth nozzle piping 335 which are vertically inserted into the casing 330. The casing 330 includes a cylindrical outer circumferential surface 330a and a facing surface 330b that is provided on a lower end part of the casing 330 and faces a central part of the upper surface of the substrate W. The first to fifth nozzle piping 331 to 335 are inner tubes.

A blocking member lifting unit 360 for moving the blocking member 306 up and down by moving the support 323 up and down is connected to the support 323. The blocking member lifting unit 360 includes a servomotor, a ball screw mechanism, and the like.

The blocking member lifting unit 360 moves the blocking member 306 and the first to fifth nozzle piping 331 to 335 up and down together with the support 323 in the vertical direction. The blocking member lifting unit 360 moves the blocking plate 321 and the first to fifth nozzle piping 331 to 335 up and down between a proximity position (a position indicated by a dashed line in FIG. 9A) close to the upper surface of the substrate W at which the substrate-facing surface 321a of the blocking plate 321 is held by the spin chuck 305 and a retraction position (a position indicated by a solid line in FIG. 9A) provided above the proximity position. The blocking member lifting unit 360 can hold the blocking plate 321 at positions between the proximity position and the retraction position.

The support 323 can be moved up and down between a lower position (a position indicated by a dashed line in FIG. 9A) and an upper position (a position indicated by a solid line in FIG. 9A) by the blocking member lifting unit 360. Accordingly, the blocking plate 321 of the blocking member 306 can be moved up and down between the proximity position close to the upper surface of the substrate W held by the spin chuck 305 and the retraction position.

Specifically, when the support 323 is positioned at the upper position, the flange support 328 and the flange part 326 of the support 323 are engaged, and thereby the engaging part 322, the blocking plate 321 and the center axis nozzle 307 are supported by the support 323. That is, the blocking plate 321 is suspended by the support 323.

When the support 323 is positioned at the upper position, a protrusion 328a protruding from an upper surface of the flange support 328 is engaged with an engagement hole 326a that is formed in the flange part 326 at intervals in the circumferential direction, and thereby the blocking plate 321 is positioned in the circumferential direction with respect to the support 323.

When the blocking member lifting unit 360 lowers the support 323 from the upper position, the blocking plate 321 also lowers from the retraction position. Then, when the spin chuck engaging part 321c of the blocking plate 321 comes in contact with the blocking member support 320, the blocking plate 321 and the center axis nozzle 307 are received by the blocking member support 320. Then, when the blocking member lifting unit 360 lowers the support 323, the flange support 328 and the flange part 326 of the support 323 are disengaged, and the engaging part 322, the blocking plate 321 and the center axis nozzle 307 are separated from the support 323, and are supported by the spin chuck 305. In this state, the blocking plate 321 rotates together with rotation of the spin chuck 305 (the spin base 318).

The first nozzle piping 331 includes a vertical part that extends in the vertical direction. A lower end of the first nozzle piping 331 is opened to the facing surface 330b of the casing 330 and forms a first discharge port 331a. A chemical liquid is supplied to the first nozzle piping 331 from the chemical liquid supply unit 308. The chemical liquid supply unit 308 includes a chemical liquid piping 336 connected to an upstream end side of the first nozzle piping 331, a chemical liquid valve 337 inserted at an intermediate part of the chemical liquid piping 336, and a first flow rate adjusting valve 338 that adjusts a degree of opening of the chemical liquid piping 336. The first flow rate adjusting valve 338 includes a valve body in which a valve seat is provided, a valve element that opens and closes the valve seat, and an actuator that moves the valve element between an open position and a closed position. This similarly applies to the other flow rate adjusting valves.

When the chemical liquid valve 337 is opened, a chemical liquid is discharged downward from the first discharge port 331a. When the chemical liquid valve 337 is closed, discharge of the chemical liquid from the first discharge port 331a is stopped. A discharge flow rate of the chemical liquid from the first discharge port 331a is adjusted by the first flow rate adjusting valve 338. The chemical liquid is TMAH (TMAH-containing chemical liquid, aqueous solution) which is an example of an organic alkali.

The second nozzle piping 332 includes a vertical part that extends in the vertical direction. A lower end of the second nozzle piping 332 is opened to the facing surface 330b of the casing 330 and forms a second discharge port 332a. A rinsing liquid is supplied to the second nozzle piping 332 from the rinsing liquid supply unit 309. The rinsing liquid supply unit 309 includes a rinsing liquid piping 339 connected to an upstream end side of the second nozzle piping 332, a rinsing liquid valve 340 inserted at an intermediate part of the rinsing liquid piping 339, and a second flow rate adjusting valve 341 that adjusts a degree of opening of the rinsing liquid piping 339. When the rinsing liquid valve 340 is opened, a rinsing liquid is discharged downward from the second discharge port 332a. When the rinsing liquid valve 340 is closed, discharge of the rinsing liquid from the second discharge port 332a is stopped. A discharge flow rate of the rinsing liquid from the second discharge port 332a is adjusted by the second flow rate adjusting valve 341. The rinsing liquid is water. In this embodiment, water is either pure water (deionized water), carbonated water, electrolytic ion water, hydrogen water, ozone water, or ammonia water at a diluted concentration (for example, about 10 to 100 ppm).

The third nozzle piping 333 includes a vertical part that extends in the vertical direction. A lower end of the third nozzle piping 333 is opened to the facing surface 330b of the casing 330 and forms a third discharge port 333a. A liquid organic solvent is supplied to the third nozzle piping 333 from an organic solvent supply unit 310. The organic solvent supply unit 310 includes an organic solvent piping 342 connected to an upstream end side of the third nozzle piping 333, an organic solvent valve 343 inserted at an intermediate part of the organic solvent piping 342, and a third flow rate adjusting valve 344 that adjusts a degree of opening of the organic solvent piping 342. When the organic solvent valve 343 is opened, a liquid organic solvent is discharged downward from the third discharge port 333a. When the organic solvent valve 343 is closed, discharge of the liquid organic solvent from the third discharge port 333a is stopped. A discharge flow rate of the liquid organic solvent from the third discharge port 333a is adjusted by the third flow rate adjusting valve 344.

In this embodiment, the organic solvent is, for example, isopropyl alcohol (IPA). However, examples of such an organic solvent include methanol, ethanol, acetone, ethylene glycol (EG) and hydrofluoroether (HFE) in addition to IPA. In addition, the organic solvent may be not only an organic solvent containing only single component but also a liquid mixed with other components. For example, a solution in which IPA and acetone are mixed or a solution in which IPA and methanol are mixed may be used.

The fourth nozzle piping 334 includes a vertical part that extends in the vertical direction. A lower end of the fourth nozzle piping 334 is opened to the facing surface 330b of the casing 330 and forms a fourth discharge port 334a. A hydrophobic agent is supplied to the fourth nozzle piping 334 from the inert-gas-containing gas supply unit 311A. The inert-gas-containing gas supply unit 311A includes an inert-gas-containing gas piping 345 connected to an upstream end side of the fourth nozzle piping 334, an inert-gas-containing gas valve 346 inserted at an intermediate part of the inert-gas-containing gas piping 345, and a fourth flow rate adjusting valve 347 that adjusts a degree of opening of the inert-gas-containing gas piping 345. When the inert-gas-containing gas valve 346 is opened, an inert-gas-containing gas is discharged downward from the fourth discharge port 334a. When the inert-gas-containing gas valve 346 is closed, discharge of the inert-gas-containing gas from the fourth discharge port 334a is stopped. A discharge flow rate of the inert-gas-containing gas from the fourth discharge port 334a is adjusted by the fourth flow rate adjusting valve 347. The inert-gas-containing gas may be nitrogen gas or a mixed gas of nitrogen gas and a gas other than nitrogen gas.

The fifth nozzle piping 335 includes a vertical part that extends in the vertical direction. A lower end of the fifth nozzle piping 335 is opened to the facing surface 330b of the casing 330 and forms the fifth discharge port 335a. An oxygen-containing gas is supplied to the fifth nozzle piping 335 from the oxygen-containing gas supply unit 311B. The oxygen-containing gas supply unit 311B includes an oxygen-containing gas piping 348 connected to an upstream end side of the fifth nozzle piping 335, an oxygen-containing gas valve 349 inserted at an intermediate part of the oxygen-containing gas piping 348, and a fifth flow rate adjusting valve 350 that adjusts a degree of opening of the oxygen-containing gas piping 348. When the oxygen-containing gas valve 349 is opened, an oxygen-containing gas is discharged downward from the fifth discharge port 335a. When the oxygen-containing gas valve 349 is closed, discharge of the oxygen-containing gas from the fifth discharge port 335a is stopped. A discharge flow rate of the oxygen-containing gas from the fifth discharge port 335*a* is adjusted by the fifth flow rate adjusting valve 350.

In this embodiment, the oxygen-containing gas may be oxygen gas or a mixed gas of oxygen gas and a gas other than oxygen gas. Hereinafter, an example in which an inert-gas-containing gas is nitrogen gas which is an example of an inert gas and an oxygen-containing gas is dry air (dried clean air) containing nitrogen and oxygen at a ratio of about 8:2 will be described.

In this embodiment, according to adjustment of a flow rate by the fourth flow rate adjusting valve 347 and adjustment of a flow rate by the fifth flow rate adjusting valve 350, a mixing ratio between an oxygen-containing gas and an inert-gas-containing gas (flow rate ratio) supplied to the upper surface of the substrate W is adjusted. That is, the fourth flow rate adjusting valve 347 and the fifth flow rate adjusting valve 350 function as mixing ratio adjusting units.

The processing unit 302 further includes a bottom nozzle 351 through which a gas is supplied toward a bottom surface of the substrate W held by the spin chuck 305.

The bottom nozzle 351 includes a discharge port through which a gas is discharged upward in the vertical direction. The gas discharged from the discharge port enters the central part of the bottom surface of the substrate W held by the spin chuck 305 substantially in the vertical direction.

A bottom supply piping 352 is connected to the bottom nozzle 351. The bottom nozzle 351 is inserted into the spin shaft 317 which is a hollow shaft. An inert-gas-containing gas piping 353 and an oxygen-containing gas piping 354 are connected to the bottom supply piping 352. At the inert-gas-containing gas piping 353, an inert-gas-containing gas valve 355 for opening and closing the inert-gas-containing gas piping 353 and a sixth flow rate adjusting valve 356 that adjusts a degree of opening of the inert-gas-containing gas piping 353 are inserted. When the inert-gas-containing gas valve 355 is opened, an inert-gas-containing gas is supplied to the bottom nozzle 351. When the inert-gas-containing gas valve 355 is closed, supply of the inert-gas-containing gas to the bottom nozzle 351 is stopped. A flow rate of the inert-gas-containing gas supplied to the bottom nozzle 351 (that is, a discharge flow rate of the inert-gas-containing gas from the bottom nozzle 351) is adjusted by the sixth flow rate adjusting valve 356. The bottom nozzle 351, the bottom supply piping 352, the inert-gas-containing gas piping 353, the inert-gas-containing gas valve 355, and the sixth flow rate adjusting valve 356 constitute a gas supply unit.

In addition, at the oxygen-containing gas piping 354, an oxygen-containing gas valve 357 for opening and closing the oxygen-containing gas piping 354 and a seventh flow rate adjusting valve 358 that adjusts a degree of opening of the oxygen-containing gas piping 354 are inserted. When the oxygen-containing gas valve 357 is opened, an oxygen-containing gas is supplied to the bottom nozzle 351. When the oxygen-containing gas valve 357 is closed, supply of the oxygen-containing gas to the bottom nozzle 351 is stopped. A flow rate of the oxygen-containing gas supplied to the bottom nozzle 351 (that is, a discharge flow rate of the oxygen-containing gas from the bottom nozzle 351) is adjusted by the seventh flow rate adjusting valve 358. The bottom nozzle 351, the bottom supply piping 352, the oxygen-containing gas piping 354, the oxygen-containing gas valve 357, and the seventh flow rate adjusting valve 358 constitute a gas supply unit.

In addition, according to adjustment of a flow rate by the sixth flow rate adjusting valve 356 and adjustment of a flow rate by the seventh flow rate adjusting valve 358, a mixing ratio between an oxygen-containing gas and an inert-gas-containing gas (flow rate ratio) supplied to the upper surface of the substrate W is adjusted. That is, the sixth flow rate adjusting valve 356 and the seventh flow rate adjusting valve 358 function as mixing ratio adjusting units.

In the first embodiment, as described with reference to FIGS. 3A to 3C, the inventors found that, when dissolving of an oxygen-containing gas and an inert-gas-containing gas at a predetermined ratio in TMAH continues, a dissolved oxygen concentration in TMAH converges at a certain concentration. Further, the inventors also founds that, when a ratio of an amount of an oxygen-containing gas dissolved to an amount of an inert-gas-containing gas dissolved is relatively high, a dissolved oxygen concentration in TMAH converges at a relatively high concentration, and when a ratio of an amount of an oxygen-containing gas dissolved to an amount of an inert-gas-containing gas dissolved is relatively low, a dissolved oxygen concentration in TMAH converges at a relatively low concentration. Here, an etching rate of TMAH depends on a dissolved oxygen concentration (dissolved oxygen amount) in TMAH.

Figure 10:
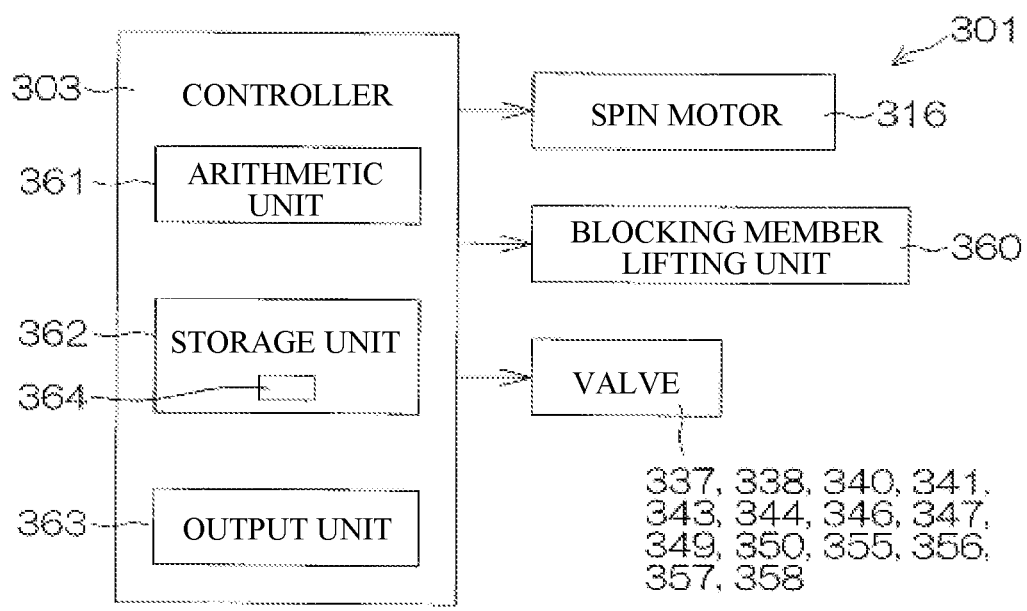
FIG. 10 is a block diagram for explaining an electrical configuration of main parts of the substrate processing device.

FIG. 10 is a block diagram for explaining an electrical configuration of main parts of the substrate processing device 301.

The controller 303 includes an arithmetic unit 361 such as a CPU, a storage unit 362 such as a fixed memory device (not shown) and a hard disk drive, an output unit 363 and an input unit (not shown). In the storage unit 362, a program that the arithmetic unit 361 executes is stored.

The storage unit 362 includes a nonvolatile memory that can electrically rewrite data. The storage unit 362 stores a concentration (a concentration of TMAH corresponding to a desired etching rate) of TMAH to be supplied to the substrate W. In addition, the storage unit 362 stores a correspondence relationship 364 between information about a supply flow rate ratio (mixing ratio) of an oxygen-containing gas and an inert-gas-containing gas and a dissolved oxygen concentration in TMAH (convergent dissolved oxygen concentration) that is converged to when an oxygen-containing gas and an inert-gas-containing gas are supplied at the supply flow rate ratio.

The correspondence relationship 364 may be stored in the form of a table, in the form of a map, or in the form of a graph (that is, an expression). Since the correspondence relationship 364 is the same as the correspondence relationship 44 (refer to FIG. 4 as an example) according to the first embodiment, detailed description thereof will be omitted.

The spin motor 316, the blocking member lifting unit 360, and the like as control objects are connected to the controller 303. In addition, the chemical liquid valve 337, the first flow rate adjusting valve 338, the rinsing liquid valve 340, the second flow rate adjusting valve 341, the organic solvent valve 343, the third flow rate adjusting valve 344, the inert-gas-containing gas valve 346, the fourth flow rate adjusting valve 347, the oxygen-containing gas valve 349, the fifth flow rate adjusting valve 350, the inert-gas-containing gas valve 355, the sixth flow rate adjusting valve 356, the oxygen-containing gas valve 357, the seventh flow rate adjusting valve 358, and the like are connected to the controller 303.

Figure 11:
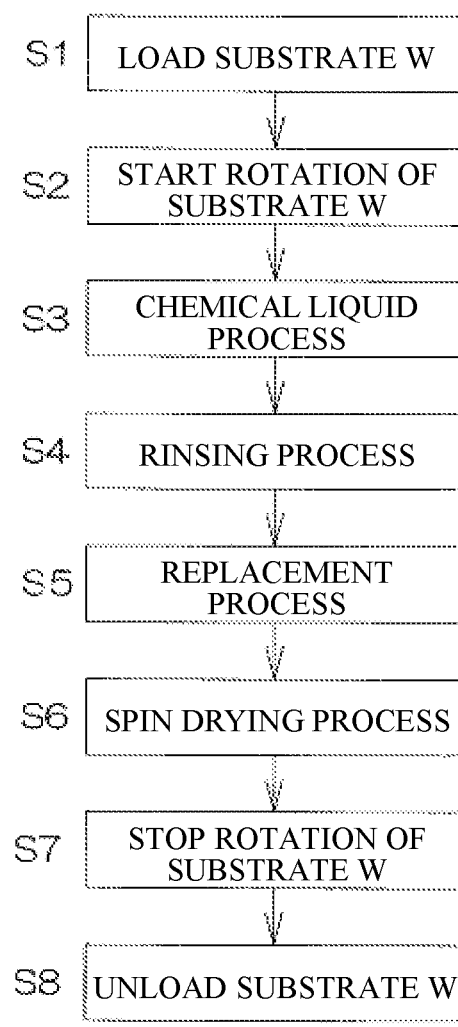
FIG. 11 is a flowchart for explaining details of an example of substrate processing performed by the processing unit.
Figure 12:
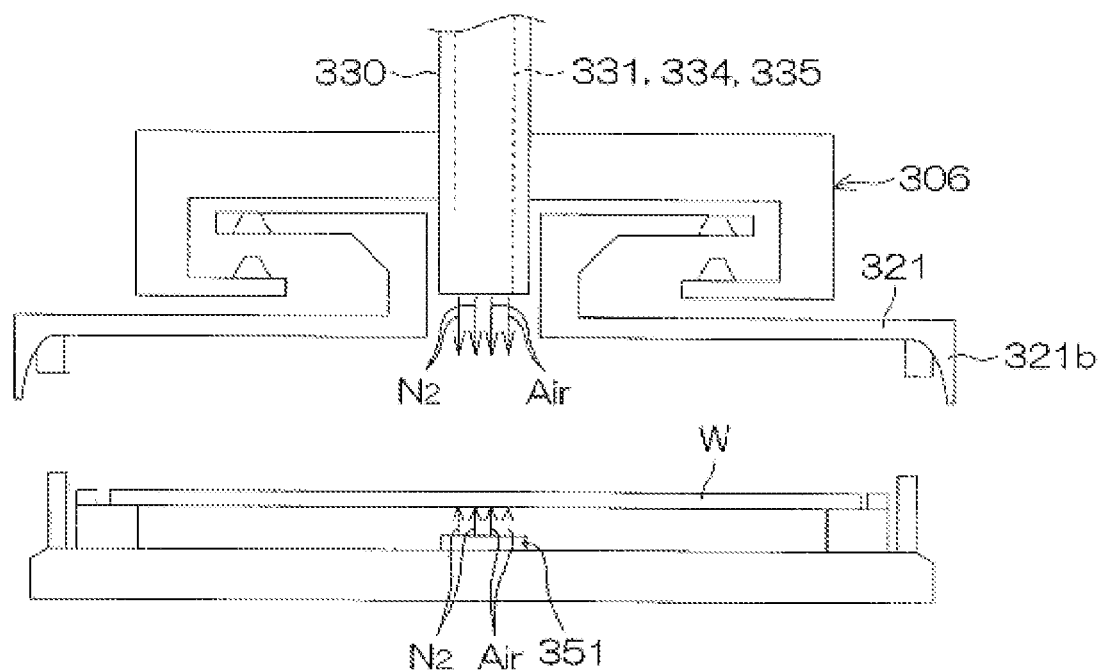
FIG. 12 is a schematic diagram for explaining a state before a chemical liquid process S1 in FIG. 11 starts.
Figure 13:
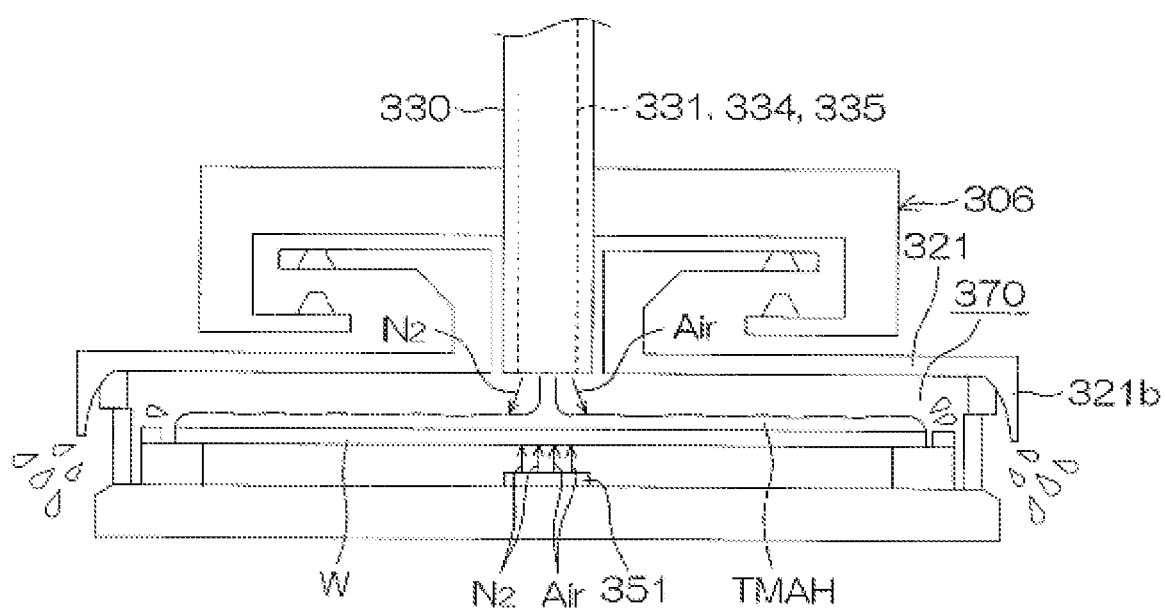
FIG. 13 is a schematic diagram for explaining the chemical liquid process S1 in FIG. 12.

FIG. 11 is a flowchart for explaining details of an example of substrate processing performed by the processing unit 302. FIG. 12 is a schematic diagram for explaining a state before a chemical liquid process S1 in FIG. 11 starts. FIG. 13 is a schematic diagram for explaining the chemical liquid process S1 in FIG. 12.

The substrate processing example will be described with reference to FIG. 8 to FIG. 11. FIG. 12 and FIG. 13 will be appropriately referred to.

An unprocessed substrate W (for example, a circular substrate with a diameter of 450 mm) is loaded into the processing unit 302 from the substrate container C by the indexer robot IR and the substrate transport robot CR, and is loaded into the chamber 304, the substrate W of which a surface (device forming surface) faces upward is delivered to the spin chuck 305, and the substrate W is held by the spin chuck 305 (S1 in FIG. 11: load the substrate W).

After the substrate transport robot CR is retracted outside the processing unit 302, the controller 303 controls the spin motor 316 so that a rotational speed of the spin base 318 increases to a predetermined liquid treatment speed (within a range of about 10 to 1200 rpm, for example, about 800 rpm) and the liquid treatment speed is maintained (S2 in FIG. 11: start rotation of the substrate W). In addition, the controller 303 controls the blocking member lifting unit 360 so that lowering of the blocking plate 321 toward the proximity position starts.

In addition, before the blocking plate 321 is disposed at the proximity position, the controller 303 opens the inert-gas-containing gas valve 346 and the oxygen-containing gas valve 349. In addition, the controller 303 controls the fourth flow rate adjusting valve 347 and the fifth flow rate adjusting valve 350, and adjusts a mixing ratio between an oxygen-containing gas and an inert-gas-containing gas (flow rate ratio) supplied to the upper surface of the substrate W. Specifically, the controller 303 acquires a dissolved oxygen concentration in TMAH supplied from the first nozzle piping 331 to the upper surface of the substrate W from the storage unit 362. In addition, the controller 303 refers to the correspondence relationship 364 between a supply flow rate ratio between an oxygen-containing gas and an inert-gas-containing gas and a convergent dissolved oxygen concentration in the storage unit 362, and acquires a supply flow rate ratio between an oxygen-containing gas and an inert-gas-containing gas when the dissolved oxygen concentration in TMAH is set as a convergent dissolved oxygen concentration. Then, the controller 303 adjusts degrees of opening of the fourth and fifth flow rate adjusting valves 347 and 350 so that the acquired supply flow rate ratio is reached. Accordingly, as shown in FIG. 12, an oxygen-containing gas and an inert-gas-containing gas are discharged from the fourth and fifth nozzle piping 334 and 335 at a supply flow rate ratio at which the dissolved oxygen concentration in TMAH becomes a convergent dissolved oxygen concentration.

In addition, before the blocking plate 321 is disposed at the proximity position, the controller 303 opens the inert-gas-containing gas valve 355 and the oxygen-containing gas valve 357. In addition, the controller 303 controls the sixth flow rate adjusting valve 356 and the seventh flow rate adjusting valve 358, and adjusts a mixing ratio between an oxygen-containing gas and an inert-gas-containing gas (flow rate ratio) supplied to the upper surface of the substrate W. Specifically, the controller 303 acquires a dissolved oxygen concentration in TMAH supplied from the first nozzle piping 331 to the upper surface of the substrate W from the storage unit 362. In addition, the controller 303 refers to the correspondence relationship 364 between a supply flow rate ratio between an oxygen-containing gas and an inert-gas-containing gas and a convergent dissolved oxygen concentration from the storage unit 362, and acquires a supply flow rate ratio between an oxygen-containing gas and an inert-gas-containing gas when the dissolved oxygen concentration in TMAH is set as a convergent dissolved oxygen concentration. Then, the controller 303 adjusts degrees of opening of the sixth flow rate adjusting valve 356 and the seventh flow rate adjusting valve 358 so that the acquired supply flow rate ratio is reached. Accordingly, as shown in FIG. 12, an oxygen-containing gas and an inert-gas-containing gas are discharged from the bottom nozzle 351 at a supply flow rate ratio at which the dissolved oxygen concentration in TMAH becomes a convergent dissolved oxygen concentration.

As shown in FIG. 13, after the blocking plate 321 is disposed at the proximity position, the controller 303 then performs a chemical liquid process S3 (refer to FIG. 5) in which TMAH is supplied to the upper surface of the substrate W. Specifically, the controller 303 opens the chemical liquid valve 337. Thus, TMAH is discharged toward the upper surface of the substrate W that is rotating from the first discharge port 331*a* of the first nozzle piping 331. TMAH supplied to the upper surface of the substrate W receives a centrifugal force due to rotation of the substrate W and moves to a peripheral part of the substrate W. Accordingly, the entire upper surface area of the substrate W is treated using TMAH.

As shown in FIG. 13, in the chemical liquid process S3, an oxygen-containing gas and an inert-gas-containing gas are discharged from fourth and fifth nozzle piping 334 and 335 and the bottom nozzle 351. Thus, these oxygen-containing gas and inert-gas-containing gas are supplied to TMAH supplied to the upper surface of the substrate W at a supply flow rate ratio at which the dissolved oxygen concentration in TMAH becomes a convergent dissolved oxygen concentration.

After the blocking plate 321 is disposed at the proximity position, a space 370 between the upper surface of the substrate W and the blocking plate 321 is blocked from the periphery of the space 370. In this state, when supply of an oxygen-containing gas and an inert-gas-containing gas continues, the space 370 can be filled with the oxygen-containing gas and the inert-gas-containing gas. Accordingly, the oxygen-containing gas and the inert-gas-containing gas can be brought into contact with TMAH in the entire upper surface area of the substrate W. Accordingly, the TMAH treatment can be performed on the substrate W with higher in-plane uniformity.

When a predetermined period has elapsed from when discharge of the chemical liquid starts, the controller 303 closes the chemical liquid valve 337 and stops discharge of TMAH from the first discharge port 331*a* of the first nozzle piping 331. Thereby, the chemical liquid process S3 ends. In addition, the controller 303 closes the inert-gas-containing gas valve 346, the oxygen-containing gas valve 349, and the oxygen-containing gas valve 357 and stops discharge of an oxygen-containing gas from the fifth nozzle piping 335 and the bottom nozzle 351. In addition, thereafter, until a spin drying process S6 ends, discharge of an inert-gas-containing gas from the fourth nozzle piping 334 and the bottom nozzle 351 continues.

Next, the controller 303 performs a rinsing process S4 (refer to FIG. 5) in which TMAH on the substrate W is replaced with a rinsing liquid and TMAH is removed from the substrate W. Specifically, the controller 303 opens the rinsing liquid valve 340. Thereby, a rinsing liquid is discharged toward the upper surface of the substrate W that is rotating from the second discharge port 332*a* of the second nozzle piping 332. The rinsing liquid supplied to the upper surface of the substrate W receives a centrifugal force due to rotation of the substrate W and moves to a peripheral part of the substrate W. Accordingly, TMAH adhered to the substrate W is washed off with the rinsing liquid. When a predetermined period has elapsed from when the rinsing liquid valve 340 is opened, the controller 303 closes the rinsing liquid valve 340. Thereby, the rinsing process S4 ends.

Next, the controller 303 performs a replacement process S5 (refer to FIG. 5). The replacement process S5 is a process in which the rinsing liquid on the substrate W is replaced with an organic solvent having a lower surface tension than the rinsing liquid (water). In addition, the controller 303 opens the organic solvent valve 343 and discharges a liquid organic solvent toward the central part of the upper surface of the substrate W from the third discharge port 333*a* of the third nozzle piping 333. In the replacement process S5, the organic solvent supplied to the upper surface of the substrate W receives a centrifugal force due to rotation of the substrate W and spreads on the entire upper surface area of the substrate W. Accordingly, in the entire upper surface area of the substrate W, the rinsing liquid adhered to the upper surface is replaced with the organic solvent.

The organic solvent supplied to the central part of the bottom surface of the substrate W receives a centrifugal force due to rotation of the substrate W and spreads on the entire bottom surface area of the substrate W. Accordingly, the organic solvent is supplied to the entire bottom surface area of the substrate W.

When a predetermined period has elapsed from when supply of the organic solvent starts, the controller 303 closes the organic solvent valve 343. Accordingly, supply of the organic solvent to the upper surface of the substrate W is stopped.

Next, the spin drying process S6 (refer to FIG. 5) in which the substrate W is dried is performed. Specifically, when the blocking plate 321 is disposed at the proximity position, the controller 303 controls the spin motor 316 so that the substrate W is accelerated to a drying rotation speed (for example, several thousands rpm) higher than a rotational speed in processes of the chemical liquid process S3 to the replacement process S5, and the substrate W rotates at the drying rotation speed. Accordingly, a large centrifugal force is applied to the liquid on the substrate W, and the liquid adhered to the substrate W is shaken off to the periphery of the substrate W. Thereby, the liquid is removed from the substrate W and the substrate W is dried.

When a predetermined period has elapsed from when the spin drying process S6 starts, the controller 303 controls the spin motor 316 so that rotation of the spin chuck 305 is stopped (S7 in FIG. 11: stop rotation of the substrate W). Then, the controller 303 controls the blocking member lifting unit 360 so that the blocking plate 321 is raised and disposed at the retraction position.

Then, the substrate transport robot CR enters the processing unit 302, and unloads the processed substrate W to the outside of the processing unit 302 (S8 in FIG. 11: unload the substrate W). The unloaded substrate W is transferred to the indexer robot IR from the substrate transport robot CR and is stored in the substrate container C by the indexer robot IR.

There are the following problems in the related art.

That is, the demand for the in-plane uniformity during an etching process is increasing. In the etching process using an organic alkali such as TMAH, there is an influence of oxygen dissolved in the chemical liquid. Thus, there is a risk of a difference in etching rates between a position (central part) directly below the chemical liquid nozzle and a position (peripheral part) furthest from the chemical liquid nozzle being generated on the main surface of the substrate. Therefore, there is a problem of the in-plane uniformity in the etching process deteriorating.

On the other hand, according to the third embodiment, together with supply of TMAH to the upper surface of the substrate W, an oxygen-containing gas and an inert-gas-containing gas at a predetermined flow rate ratio are supplied to the substrate W. Accordingly, the oxygen-containing gas and the inert-gas-containing gas at a predetermined ratio are dissolved in TMAH supplied to the upper surface of the substrate W. As described above, when dissolving of the oxygen-containing gas and the inert-gas-containing gas at a predetermined ratio in TMAH continues, the dissolved oxygen concentration in TMAH converges at a certain concentration. Thus, when dissolving of the oxygen-containing gas and the inert-gas-containing gas at a predetermined ratio in TMAH supplied to the upper surface of the substrate W continues, the dissolved oxygen concentration in TMAH supplied to the upper surface of the substrate W can be kept constant. When an oxygen-containing gas and an inert-gas-containing gas are brought into contact with TMAH in the entire upper surface area of the substrate W, the dissolved oxygen concentration in TMAH can be kept constant in the entire upper surface area of the substrate W. Accordingly, a TMAH treatment can be performed on the upper surface of the substrate W with high in-plane uniformity.

In addition, since a mixing ratio between an oxygen-containing gas and an inert-gas-containing gas (flow rate ratio) supplied to TMAH is a mixing ratio (flow rate ratio) at which the same concentration as the dissolved oxygen concentration in TMAH is set as a target dissolved oxygen concentration, the dissolved oxygen concentration in TMAH can be kept at a desired dissolved oxygen concentration in the entire upper surface area of the substrate W. Accordingly, a TMAH treatment can be performed on the entire area of the substrate W at a desired etching rate.

While three embodiments of the present disclosure have been described above, the present disclosure can be implemented as still another embodiment.

Figure 14A:
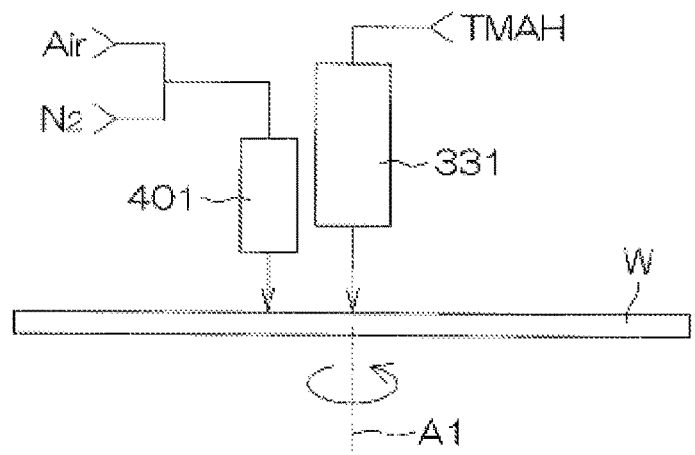
FIGS. 14A to 14C are diagrams showing modified examples of the present disclosure.
Figure 14B:
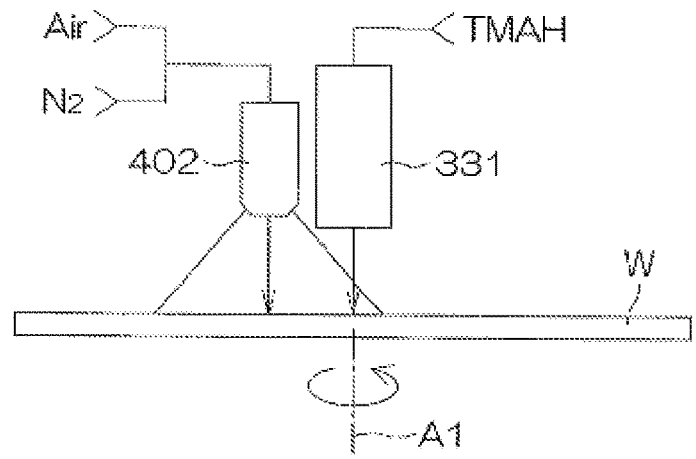
Figure 14C:
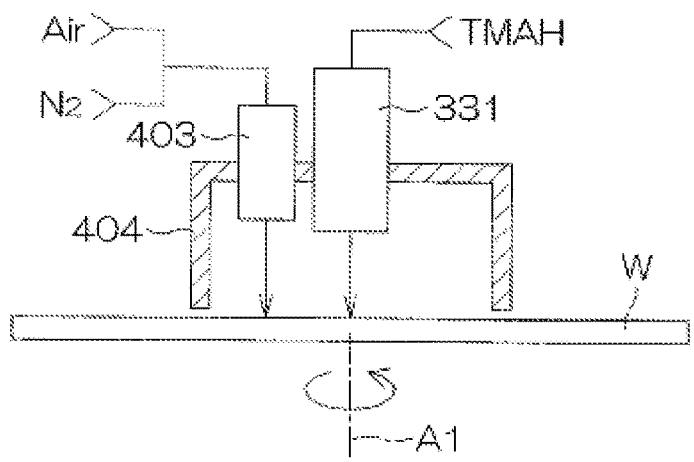

For example, a configuration in which an oxygen-containing gas and an inert-gas-containing gas are supplied to the space 370 blocked from the periphery by the blocking member 306 and thus supplied to the entire upper surface area of the substrate W has been described in the second embodiment. However, as shown in FIG. 14A to FIG. 14C, an example in which an oxygen-containing gas and an inert-gas-containing gas are sprayed (discharged) toward a region near a discharge port of the chemical liquid nozzle (the first nozzle piping 331) without using the blocking member 306 can be proposed. In this case, when an oxygen-containing gas and an inert-gas-containing gas are sprayed to TMAH discharged from the discharge port of the chemical liquid nozzle (the first nozzle piping 331), the oxygen-containing gas and the inert-gas-containing gas can be efficiently dissolved in the chemical liquid supplied to the upper surface of the substrate W.

Specifically, for example, as shown in FIG. 14A, an oxygen-containing gas and an inert-gas-containing gas may be sprayed downward from a gas nozzle 401 having directivity in the discharge direction. In this case, a discharge port of the gas nozzle 401 is closer to the upper surface of the substrate W than the discharge port of the first nozzle piping 331.

In addition, as shown in FIG. 14B, an oxygen-containing gas and an inert-gas-containing gas may be sprayed from a gas nozzle 402 which is a spray nozzle through which a gas is discharged over a wide range. In this case, a spray region of the gas nozzle 402 overlaps a position of TMAH transferred from the first nozzle piping 331 in a plan view.

In addition, as shown in FIG. 14C, a cover 404 surrounding the periphery of the first nozzle piping 331 and a gas nozzle 403 may be provided. In this case, at least a part of a lower end edge of the cover 404 is disposed below a discharge port of the first nozzle piping 331 and a discharge port of the gas nozzle 403.

In addition, the gas dissolving units 26, 223, 228, and 235 have been described as units configured to supply a mixed gas containing an oxygen-containing gas and an inert-gas-containing gas at a predetermined mixing ratio to TMAH in the first and second embodiments. However, an inert gas dissolving unit configured to dissolve an inert-gas-containing gas in TMAH by supplying the inert-gas-containing gas and an oxygen gas dissolving unit configured to dissolve an oxygen-containing gas in TMAH by supplying the oxygen-containing gas are provided, and an oxygen-containing gas and an inert-gas-containing gas may be supplied at a predetermined supply flow rate ratio at the same time from respective gas dissolving units.

In addition, the gas dissolving units 26, 223, 228, and 235 have been described as bubbling units configured to generate bubbles in TMAH by discharging an oxygen-containing gas and an inert-gas-containing gas from a gas discharge port disposed in TMAH stored in the tank in the first and second embodiments. However, the gas dissolving units 26, 223, 228, and 235 may be units configured to dissolve an oxygen-containing gas and an inert-gas-containing gas in TMAH by discharging the oxygen-containing gas and the inert-gas-containing gas from a discharge port disposed above a surface of a liquid in the tank.

In addition, while TMAH (TMAH-containing chemical liquid) has been exemplified as the chemical liquid in the first to third embodiments, the present disclosure can also be suitably applied to an organic alkali such as tetraethylammonium hydroxide (TEAH). In addition, the chemical liquid is not limited to the organic alkali, and the present disclosure can be applied to a chemical liquid of NH4OH, KOH, or the like.

In addition, while the substrate processing devices 1, 201, and 301 have been described as devices configured to process the substrate W which is a semiconductor wafer in the above embodiments, the substrate processing device may be a device configured to process a substrate, for example, a substrate for a liquid crystal display device, a substrate for a flat panel display (FPD) such as an organic EL (electroluminescence) display device, a substrate for an optical disc, a substrate for a magnetic disk, a substrate for a magneto-optical disc, a substrate for a photomask, a ceramic substrate, or a substrate for a solar cell.

The following features in addition to the features described in the claims can be derived from this specification and the appended drawings. These features can be arbitrarily combined with features described in the means for solving the problem.

A1. A substrate processing method including a chemical liquid process in which a chemical liquid is supplied and a gas supply process in which an oxygen-containing gas which contains oxygen gas and an inert-gas-containing gas which contains an inert gas at a predetermined mixing ratio are supplied to the chemical liquid supplied to a main surface of the substrate.

According to the method of A1, together with supply of the chemical liquid to the main surface of the substrate, an oxygen-containing gas and an inert-gas-containing gas are supplied at a predetermined mixing ratio (flow rate ratio). Accordingly, an oxygen-containing gas and an inert-gas-containing gas are dissolved at a predetermined ratio in the chemical liquid supplied to the main surface of the substrate. The inventors found that, when dissolving of an oxygen-containing gas and an inert-gas-containing gas at a predetermined ratio in the chemical liquid continues, a dissolved oxygen concentration in the chemical liquid converges at a certain concentration. In addition, the inventors found that, when a ratio of an amount of an oxygen-containing gas dissolved to an amount of an inert-gas-containing gas dissolved is relatively high, a dissolved oxygen concentration in the chemical liquid converges at a relatively high concentration, and when a ratio of an amount of an oxygen-containing gas dissolved to an amount of an inert-gas-containing gas dissolved is relatively low, a dissolved oxygen concentration in the chemical liquid converges at a relatively low concentration.

Thus, when dissolving of an oxygen-containing gas and an inert-gas-containing gas at a predetermined ratio in the chemical liquid supplied to the main surface of the substrate continues, a dissolved oxygen concentration in the chemical liquid supplied to the main surface of the substrate can be kept constant. When an oxygen-containing gas and an inert-gas-containing gas are brought into contact with the chemical liquid in the entire main surface area of the substrate, a dissolved oxygen concentration in the chemical liquid can be kept constant in the entire main surface area of the substrate. Accordingly, a chemical liquid treatment can be performed on the substrate with high in-plane uniformity.

A2. The substrate processing method according to A1, wherein, in the chemical liquid process, a chemical liquid having a predetermined dissolved oxygen concentration is supplied to the main surface of the substrate, the gas supply process includes a process in which supply is performed at the mixing ratio at which the predetermined dissolved oxygen concentration reaches a target dissolved oxygen concentration.

According to the method of A2, the mixing ratio between an oxygen-containing gas and an inert-gas-containing gas (flow rate ratio) supplied to the chemical liquid is a mixing ratio (flow rate ratio) at which the same concentration as the dissolved oxygen concentration in the chemical liquid is set as a target dissolved oxygen concentration. Therefore, the dissolved oxygen concentration in the chemical liquid can be kept at a desired dissolved oxygen concentration in the entire main surface area of the substrate. Accordingly, a chemical liquid treatment can be performed on the entire area of the substrate at a desired etching rate.

A3. The substrate processing method according to A1 or A2, further including a blocking process in which a blocking member is disposed opposite to the main surface of the substrate at intervals and a space above the main surface of the substrate is blocked from the periphery of the space together with the gas supply process.

According to the method of A3, while the blocking member is disposed to face the main surface of the substrate at intervals, a space between the main surface of the substrate and the blocking member is blocked from the periphery of the space. Thus, the space can be filled with an oxygen-containing gas and an inert-gas-containing gas. Accordingly, the oxygen-containing gas and the inert-gas-containing gas can be brought into contact with the chemical liquid in the entire main surface area of the substrate. Accordingly, the chemical liquid treatment can be performed on the substrate with higher in-plane uniformity.

A4. The substrate processing method according to any one of A1 to A3, wherein the gas supply process includes a process in which an oxygen-containing gas and an inert-gas-containing gas are discharged toward a region near a discharge port of a chemical liquid nozzle.

According to the method of A4, when an oxygen-containing gas and an inert-gas-containing gas are sprayed to the chemical liquid discharged from the discharge port of the chemical liquid nozzle, the oxygen-containing gas and the inert-gas-containing gas can be efficiently dissolved in the chemical liquid supplied to the main surface of the substrate.

A5. The substrate processing method according to any one of A1 to A4, wherein the chemical liquid supplied to the main surface of the substrate includes a TMAH-containing chemical liquid which contains tetramethylammonium hydroxide (TMAH).

A6. The substrate processing method according to any one of A1 to A5, wherein the substrate includes a silicon substrate.

B1. A substrate processing device including:
a substrate holding unit configured to hold a substrate;
a chemical liquid supply unit configured to supply a chemical liquid to a main surface of the substrate held by the substrate holding unit;
a gas supply unit configured to supply an oxygen-containing gas which contains oxygen gas and an inert-gas-containing gas which contains an inert gas to the substrate held by the substrate holding unit; and
a controller configured to control the chemical liquid supply unit and the gas supply unit,
wherein the controller performs a chemical liquid process in which a chemical liquid is supplied to the substrate by the chemical liquid supply unit, and a gas supply process in which an oxygen-containing gas which contains oxygen gas and an inert-gas-containing gas which contains an inert gas are supplied at a predetermined mixing ratio to the chemical liquid supplied to the main surface of the substrate.

According to the configuration of B1, together with supply of the chemical liquid to the main surface of the substrate, an oxygen-containing gas and an inert-gas-containing gas are supplied at a predetermined mixing ratio (flow rate ratio). Accordingly, an oxygen-containing gas and an inert-gas-containing gas are dissolved at a predetermined ratio in the chemical liquid supplied to the main surface of the substrate.

The inventors found that, when dissolving of an oxygen-containing gas and an inert-gas-containing gas at a predetermined ratio in the chemical liquid continues, a dissolved oxygen concentration in the chemical liquid converges at a certain concentration. In addition, the inventors found that, when a ratio of an amount of an oxygen-containing gas dissolved to an amount of an inert-gas-containing gas dissolved is relatively high, a dissolved oxygen concentration in the chemical liquid converges at a relatively high concentration, and when a ratio of an amount of an oxygen-containing gas dissolved to an amount of an inert-gas-containing gas dissolved is relatively low, a dissolved oxygen concentration in the chemical liquid converges at a relatively low concentration.

Thus, when dissolving of an oxygen-containing gas and an inert-gas-containing gas at a predetermined ratio in the chemical liquid supplied to the main surface of the substrate continues, a dissolved oxygen concentration in the chemical liquid supplied to the main surface of the substrate can be kept constant. When an oxygen-containing gas and an inert-gas-containing gas are supplied to the chemical liquid in the entire main surface area of the substrate, a dissolved oxygen concentration in the chemical liquid can be kept constant in the entire main surface area of the substrate. Accordingly, a chemical liquid treatment can be performed on the substrate with high in-plane uniformity.

B2. The substrate processing device according to B1,
wherein the controller supplies a chemical liquid having a predetermined dissolved oxygen concentration to the main surface of the substrate in the chemical liquid process, and
the controller performs a process in which supply is performed at the mixing ratio at which the predetermined dissolved oxygen concentration reaches a target dissolved oxygen concentration in the gas supply process.

According to the configuration of B2, the mixing ratio (flow rate ratio) of an oxygen-containing gas and an inert-gas-containing gas supplied to the chemical liquid is a mixing ratio (flow rate ratio) at which the same concentration as the dissolved oxygen concentration of the chemical liquid is set as a target dissolved oxygen concentration. Therefore, the dissolved oxygen concentration in the chemical liquid can be kept at a desired dissolved oxygen concentration in the entire main surface area of the substrate. Accordingly, the chemical liquid can be applied to the entire area of the substrate at a desired etching rate.

B3. The substrate processing device according to B1 or B2, further including a blocking member that is disposed to face the main surface of the substrate held by the substrate holding unit at intervals and blocks a space above the main surface of the substrate from the periphery of the space.

According to the configuration of B3, while the blocking member is disposed to face the main surface of the substrate at intervals, a space between the main surface of the substrate and the blocking member is blocked from the periphery of the space. Thus, the space can be filled with an oxygen-containing gas and an inert-gas-containing gas. Accordingly, the oxygen-containing gas and the inert-gas-containing gas can be brought into contact with the chemical liquid in the entire main surface area of the substrate. Accordingly, the chemical liquid treatment can be performed on the substrate with higher in-plane uniformity.

B4. The substrate processing device according to any one of B1 to B3,
wherein the gas supply unit further includes a mixing ratio adjusting unit configured to adjust a mixing ratio between the oxygen-containing gas supplied to the substrate and the inert-gas-containing gas supplied to the substrate.

In such a configuration, when the mixing ratio (flow rate ratio) is adjusted by the mixing ratio adjusting unit (flow rate ratio adjusting unit), it is possible to adjust a ratio of the oxygen-containing gas and the inert-gas-containing gas dissolved in the chemical liquid. Accordingly, it is possible to adjust a target dissolved oxygen concentration of the chemical liquid supplied to the main surface of the substrate.

B5. The substrate processing device according to any one of B1 to B4,
wherein the chemical liquid supply unit includes a chemical liquid nozzle including a discharge port through which the chemical liquid is discharged,
the gas supply unit includes a gas nozzle through which the oxygen-containing gas and the inert-gas-containing gas are discharged toward a region near the discharge port, and
the controller performs a process in which the oxygen-containing gas and the inert-gas-containing gas are discharged from the gas nozzle toward a region near the discharge port in the gas supply process.

According to the configuration of B5, when an oxygen-containing gas and an inert-gas-containing gas are sprayed to the chemical liquid discharged from the discharge port of the chemical liquid nozzle, the oxygen-containing gas and the inert-gas-containing gas can be efficiently dissolved in the chemical liquid supplied to the main surface of the substrate.

While the embodiments of the present disclosure have been described in detail, these are only specific examples used to clarify technical content of the present disclosure. The present disclosure should not be interpreted as being limited to these specific examples, and the scope of the present disclosure is only limited by the scope of the appended claims.

This application corresponds to Japanese Laid-open No. 2017-183007, filed Sep. 22, 2017, and the content of which is incorporated herein by reference.

What is claimed is:

1. A chemical liquid preparation method of preparing a chemical liquid to be supplied to a substrate, comprising:
    a setting step of setting a mixing ratio of an oxygen-containing gas and an inert-gas-containing gas corresponding to a predetermined target dissolved oxygen concentration in the chemical liquid;
    an operating step of operating a first flow rate adjusting valve to supply the oxygen-containing gas with a first supply flow rate from an oxygen-containing gas piping to a mixed gas piping and operating a second flow rate adjusting valve to supply the inert-gas-containing gas with a second supply flow rate from an inert-gas-containing gas piping to the mixed gas piping, wherein a ratio of the first supply flow rate and the second supply flow rate is corresponding to the set mixing ratio, so as to produce a mixed gas of the oxygen-containing gas and the inert-gas-containing gas in the mixed gas piping; and
    a gas dissolving step of supplying the mixed gas from the mixed gas piping into the chemical liquid and dissolving the mixed gas in the chemical liquid so as to adjust a dissolved oxygen concentration to the predetermined target dissolved oxygen concentration.

2. The chemical liquid preparation method according to claim 1,
    wherein the chemical liquid to be prepared comprises a TMAH-containing chemical liquid which contains tetramethylammonium hydroxide (TMAH).

3. The chemical liquid preparation method according to claim 1,
    wherein the gas dissolving step comprises a process in which bubbles are generated in the chemical liquid by discharging the mixed gas in the chemical liquid.

4. The chemical liquid preparation method according to claim 2,
    wherein the gas dissolving step comprises a process in which bubbles are generated in the chemical liquid by discharging the mixed gas in the chemical liquid.

5. The chemical liquid preparation method according to claim 1,
    wherein the chemical liquid to be subjected to the gas dissolving step comprises a chemical liquid recovered from a processing unit.

6. A chemical liquid preparation method of preparing a chemical liquid to be supplied to a substrate, comprising:
    a first operating step of operating a first flow rate adjusting valve to supply an oxygen-containing gas with a first supply flow rate from a first oxygen-containing gas piping to a first mixed gas piping and operating a second flow rate adjusting valve to supply an inert-gas-containing gas with a second supply flow rate from a first inert-gas-containing gas piping to the first mixed gas piping, wherein a ratio of the first supply flow rate and the second supply flow rate in the first operating step is corresponding to a first predetermined mixing ratio, so as to produce a first mixed gas of the oxygen-containing gas and the inert-gas-containing gas in the first mixed gas piping;
    a first gas dissolving step of supplying the first mixed gas from the first mixed gas piping into the chemical liquid and dissolving the first mixed gas in the chemical liquid so as to adjust a dissolved oxygen concentration in the chemical liquid;
    a second operating step of operating a third flow rate adjusting valve to supply the oxygen-containing gas with a third supply flow rate from a second oxygen-containing gas piping to a second mixed gas piping and operating a fourth flow rate adjusting valve to supply the inert-gas-containing gas with a fourth supply flow rate from a second inert-gas-containing gas piping to the second mixed gas piping, wherein a ratio of the third supply flow rate and the fourth supply flow rate in the second operating step is corresponding to a second predetermined mixing ratio which corresponds to a predetermined target dissolved oxygen concentration in the chemical liquid, so as to produce a second mixed gas of the oxygen-containing gas and the inert-gas-containing gas in the second mixed gas piping;
    a second gas dissolving step of, after the first gas dissolving step, supplying the second mixed gas from the second mixed gas piping into the chemical liquid and dissolving the second mixed gas in the chemical liquid so as to further adjust the dissolved oxygen concentration in the chemical liquid whose oxygen concentration has been adjusted by the first gas dissolving step.

7. The chemical liquid preparation method according to claim 6,
    wherein the first predetermined mixing ratio is the same as the second predetermined mixing ratio.

8. The chemical liquid preparation method according to claim 6,
    wherein, the first predetermined mixing ratio is lower in the oxygen-containing gas ratio than the second predetermined mixing ratio.

9. The chemical liquid preparation method according to claim 1, further comprising
    a measurement step in which a dissolved oxygen concentration of the chemical liquid after gas is dissolved by the gas dissolving step is measured;
    an inert gas dissolving step in which, when the dissolved oxygen concentration measured in the measurement step is higher than the target dissolved oxygen concentration, the inert-gas-containing gas is dissolved in the chemical liquid obtained after gas is dissolved by the gas dissolving step by supplying the inert-gas-containing gas to the chemical liquid obtained after gas is dissolved by the gas dissolving step; and
    an oxygen-containing gas dissolving step in which, when the dissolved oxygen concentration measured in the measurement step is lower than the target dissolved oxygen concentration, the oxygen-containing gas is dissolved in the chemical liquid obtained after gas is dissolved by the gas dissolving step by supplying the oxygen-containing gas to the chemical liquid obtained after gas is dissolved by the gas dissolving step.

\* \* \* \* \*